United States Patent
Kato et al.

(10) Patent No.: US 12,099,303 B2
(45) Date of Patent: Sep. 24, 2024

(54) RESIST UNDERLAYER FILM-FORMING COMPOSITION INCLUDING REACTION PRODUCT OF ACID DIANHYDRIDE

(71) Applicant: NISSAN CHEMICAL CORPORATION, Tokyo (JP)

(72) Inventors: Yuki Kato, Toyama (JP); Tomotada Hirohara, Toyama (JP); Mamoru Tamura, Toyama (JP)

(73) Assignee: NISSAN CHEMICAL CORPORATION, Tokyo (JP)

( * ) Notice: Subject to any disclaimer, the term of this patent is extended or adjusted under 35 U.S.C. 154(b) by 0 days.

(21) Appl. No.: 18/271,383

(22) PCT Filed: Jan. 26, 2022

(86) PCT No.: PCT/JP2022/002758
§ 371 (c)(1),
(2) Date: Jul. 7, 2023

(87) PCT Pub. No.: WO2022/163673
PCT Pub. Date: Aug. 4, 2022

(65) Prior Publication Data
US 2024/0118620 A1 Apr. 11, 2024

(30) Foreign Application Priority Data
Jan. 27, 2021 (JP) ................... 2021-011399

(51) Int. Cl.
*G03F 7/11* (2006.01)
*C08G 59/32* (2006.01)
*C09D 163/00* (2006.01)
*H01L 21/027* (2006.01)

(52) U.S. Cl.
CPC ............ *G03F 7/11* (2013.01); *C08G 59/3245* (2013.01); *C09D 163/00* (2013.01); *H01L 21/0274* (2013.01)

(58) Field of Classification Search
CPC .......... G03F 7/11; G03F 7/091; G03F 7/094; G03F 7/20; C08G 59/3245; C08G 59/14; C08G 59/18; C09D 163/00; H01L 21/0274; H01L 21/027; H01L 21/3213; Y10S 430/1055
USPC .................. 438/703; 430/327, 296
See application file for complete search history.

(56) References Cited

U.S. PATENT DOCUMENTS

| | | | |
|---|---|---|---|
| 2008/0038678 A1* | 2/2008 | Kishioka ............ | C08G 73/0616 430/327 |
| 2011/0059404 A1 | 3/2011 | Sakamoto et al. | |
| 2012/0251955 A1* | 10/2012 | Sakamoto ............ | C08G 59/4223 430/296 |
| 2014/0170567 A1 | 6/2014 | Sakamoto et al. | |
| 2019/0177475 A1 | 6/2019 | Ogata et al. | |
| 2021/0397090 A1* | 12/2021 | Shimizu .............. | H01L 21/0276 |
| 2024/0085792 A1* | 3/2024 | Hirohara ................... | G03F 7/20 |

FOREIGN PATENT DOCUMENTS

| | | |
|---|---|---|
| JP | 2012-078602 A | 4/2012 |
| WO | 2009/104685 A1 | 8/2009 |
| WO | 2013/018802 A1 | 2/2013 |
| WO | 2017/154600 A1 | 9/2017 |

OTHER PUBLICATIONS

Mar. 26, 2024 Decision to Grant a Patent issued in Korean Patent Application No. 10-2023-7020124.
Apr. 19, 2022 International Search Report issued in International Patent Application No. PCT/JP2022/002758.
Jul. 31, 2023 International Preliminary Report on Patentability issued in International Patent Application No. PCT/JP2022/002758.

* cited by examiner

*Primary Examiner* — Caleen O Sullivan
(74) *Attorney, Agent, or Firm* — Oliff PLC

(57) ABSTRACT

A composition for forming a resist underlayer film that enables the formation of a desired resist pattern; and a method for producing a resist pattern and a method for producing a semiconductor device, each of which uses said composition for forming a resist underlayer film. A resist underlayer film-forming composition includes a solvent and a polymer having a unit structure represented by formula (I):

(in formula (I), $A^1$, $A^2$, $A^3$, $A^4$, $A^5$, and $A^6$ each independently represent a hydrogen atom, a methyl group, or an ethyl group, $Q^1$ represents a divalent organic group, $R^1$ represents a tetravalent organic group including a C6-40 aromatic ring structure, and $L^1$ and $L^2$ each independently represent a hydrogen atom or a C1-10 alkyl group optionally substituted with a hydroxy group and optionally interrupted by an oxygen atom).

13 Claims, No Drawings

RESIST UNDERLAYER FILM-FORMING COMPOSITION INCLUDING REACTION PRODUCT OF ACID DIANHYDRIDE

TECHNICAL FIELD

The present invention relates to a composition used in a lithography process, particularly in a leading-edge (for example, ArF, EUV, or EB) lithography process, for semiconductor production. The present invention also relates to the application of a resist underlayer film from the composition to a method for producing a resist-patterned substrate and to a method for manufacturing a semiconductor device.

BACKGROUND ART

The manufacturing of semiconductor devices has conventionally involved lithographic microprocessing using a resist composition. In the microprocessing, a thin film of a photoresist composition is formed on a semiconductor substrate, such as a silicon wafer, and is irradiated with an active ray, such as ultraviolet light, through a mask pattern for drawing a device pattern. The latent image is then developed, and the substrate is etched while using the thus-obtained photoresist pattern as a protective film, thereby forming fine irregularities corresponding to the pattern on the substrate surface. Active rays of conventional choice are i-ray (365 nm wavelength), KrF excimer laser beam (248 nm wavelength), and ArF excimer laser beam (193 nm wavelength). In addition, EUV light (extreme ultraviolet light, 13.5 nm wavelength) and EB (electron beam) are studied for practical use in the leading-edge microprocessing due to the recent increase in the packing density of semiconductor devices. A growing problem along with this trend is that resists receive a greater influence from semiconductor substrates.

An approach that has widely been studied to solve the above problem is to provide a resist underlayer film between a resist and a semiconductor substrate. Patent Literature 1 discloses a resist underlayer film-forming composition that includes a polymer obtained by reacting a tetracarboxylic dianhydride having an alicyclic structure or an aliphatic structure with a diepoxy-containing compound. Patent Literature 2 discloses a resist underlayer film-forming composition that includes a polymer obtained by reacting a specific heterocyclic compound with a diepoxy-containing compound.

CITATION LIST

Patent Literature

Patent Literature 1: WO 2009/104685
Patent Literature 2: WO 2013/018802

SUMMARY OF INVENTION

Technical Problem

For example, the properties required of resist underlayer films are that the resist underlayer film is not intermixed with a resist film formed on top thereof (is insoluble in a resist solvent) and that the dry etching rate is higher than that of a resist film.

In EUV lithography, the line width of a resist pattern that is formed is 32 nm or less. Thus, a resist underlayer film for EUV exposure is formed with a smaller film thickness than conventional. Such a thin film is hardly uniform and tends to have defects, such as pinholes and aggregations, due to the influence of, for example, the substrate surface and the polymer that is used.

Meanwhile, in the formation of a resist pattern, a resist is sometimes developed by removing unexposed portions of the resist film with a solvent, usually an organic solvent, capable of dissolving the resist film, thus leaving the exposed portions of the resist film as a resist pattern. In such a negative development process, the major challenge resides in improving the adhesion of the resist pattern.

Furthermore, there are demands that a resist pattern should be formed with a good rectangular shape while reducing or eliminating the deterioration in LWR (line width roughness, variation (roughness)) in line width) at the time of resist pattern formation, and the resist sensitivity should be enhanced.

Objects of the present invention are to provide a composition for forming a resist underlayer film that allows a desired resist pattern to be formed, and to provide a resist pattern forming method using the resist underlayer film-forming composition, thereby solving the problems discussed above.

Solution to Problem

The present invention embraces the following.

[1] A resist underlayer film-forming composition comprising a polymer and a solvent, the polymer having a unit structure represented by the following formula (I):

[Chem. 1]

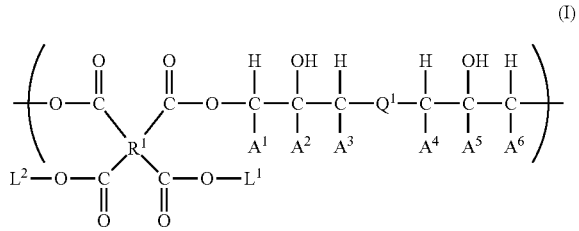

wherein, in formula (I), $A^1$, $A^2$, $A^3$, $A^4$, $A^5$, and $A^6$ each independently denote a hydrogen atom, a methyl group, or an ethyl group; $Q^1$ denotes a divalent organic group; $R^1$ denotes a tetravalent organic group comprising a C6-C40 aromatic ring structure; and $L^1$ and $L^2$ each independently denote a hydrogen atom or a C1-C10 alkyl group optionally substituted with a hydroxy group and optionally interrupted by an oxygen atom.

[2] The resist underlayer film-forming composition according to [1], wherein $R^1$ comprises a biphenylene structure.

[3] The resist underlayer film-forming composition according to [1] or [2], wherein the polymer comprises a repeating unit represented by the following formula (a-2):

[Chem. 2]

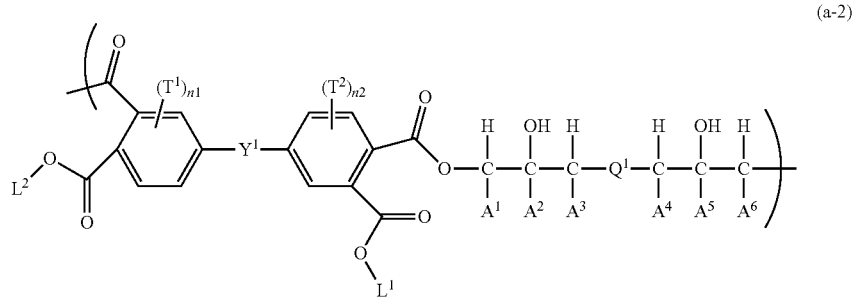

(a-2)

wherein, in formula (a-2), $Y^1$ denotes a single bond, an oxygen atom, a sulfur atom, a C1-C10 alkylene group optionally substituted with a halogen atom or a C6-C40 aryl group, or a sulfonyl group; n1 quantity of $T^1$ and n2 quantity of $T^2$ each independently denote a hydrogen atom or a C1-C10 alkyl group, and are optionally bonded to each other to bridge the two benzene rings;

n1 and n2 each independently denote an integer of 0 to 4; and $Q^1, A^1, A^2, A^3, A^4, A^5, A^6, L^1$, and $L^2$ are the same as defined in [1].

[4] The resist underlayer film-forming composition according to any one of [1] to [3], wherein the polymer further has a heterocyclic structure.

[5] The resist underlayer film-forming composition according to any one of [1] to [4], wherein $Y^1$ is a sulfonyl group.

[6] The resist underlayer film-forming composition according to any one of [1] to [5], wherein an end of the polymer is capped with a compound.

[7] The resist underlayer film-forming composition according to [6], wherein the compound comprises an optionally substituted aliphatic ring.

[8] The resist underlayer film-forming composition according to [6], wherein the compound is represented by formula (1) and formula (2) below:

[Chem. 3]

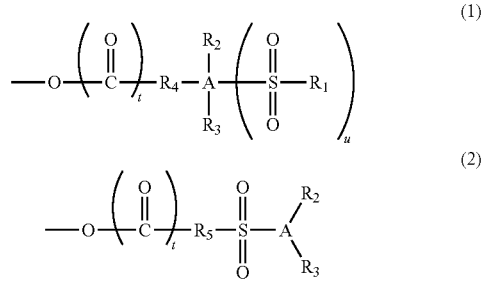

wherein, in formulas (1) and (2), $R_1$ denotes a C1-C6 alkyl group, a phenyl group, a pyridyl group, a halogeno group, or a hydroxy group, and optionally has a substituent; $R_2$ denotes a hydrogen atom, a C1-C6 alkyl group, a hydroxy group, a halogeno group, or an ester group represented by —C(=O)O—X where X denotes an optionally substituted C1-C6 alkyl group; $R_3$ denotes a hydrogen atom, a C1-C6 alkyl group, a hydroxy group, or a halogeno group; $R_4$ denotes a direct bond or a C1-C8 divalent organic group; $R_5$ denotes a C1-C8 divalent organic group; A denotes an aromatic ring or an aromatic heterocyclic ring; t denotes 0 or 1; and u denotes 1 or 2.

[9] The resist underlayer film-forming composition according to any one of [1] to [8], further comprising a curing catalyst.

[10] The resist underlayer film-forming composition according to any one of [1] to [9], further comprising a crosslinking agent.

[11] A resist underlayer film, which is a baked product of a coating film of the resist underlayer film-forming composition according to any one of [1] to [10].

[12] A method for producing a patterned substrate, comprising the steps of:

applying the resist underlayer film-forming composition according to any one of [1] onto a semiconductor substrate and baking the applied composition to form a resist underlayer film;

applying a resist onto the resist underlayer film and baking the applied resist to form a resist film;

exposing the semiconductor substrate coated with the resist underlayer film and the resist; and developing the exposed resist film, and performing patterning.

[13] A method for manufacturing a semiconductor device, comprising the steps of:

forming on a semiconductor substrate a resist underlayer film of the resist underlayer film-forming composition according to any one of [1] to [10];

forming a resist film on the resist underlayer film;

forming a resist pattern by applying a light or electron beam to the resist film followed by development;

forming a pattern in the resist underlayer film by etching the resist underlayer film through the resist pattern formed; and processing the semiconductor substrate through the pattern in the resist underlayer film.

Advantageous Effects of Invention

The resist underlayer film-forming composition described above can form a resist underlayer film that exhibits excellent resistance to an organic solvent used in a photoresist formed on the underlayer film, and also attains good uniformity in film thickness even when formed extremely thin (with a film thickness of 10 nm or less). Moreover, the resist underlayer film-forming composition of the present invention can be patterned into a smaller critical resolution size without collapse of the resist pattern after development as compared to a conventional resist underlayer film, thus allowing for the formation of a finer resist pattern. Furthermore, the resist underlayer film-forming composition effectively exhibits good patternability and can be patterned into lines with no or reduced occurrence of bridges.

DESCRIPTION OF EMBODIMENTS

<Resist Underlayer Film-Forming Compositions>

A resist underlayer film-forming composition of the present invention contains a polymer and a solvent. The polymer has a unit structure represented by the following formula (I):

[Chem. 4]

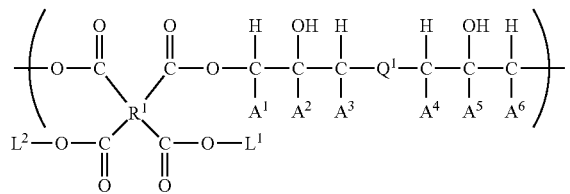

(I)

wherein, in formula (I), $A^1$, $A^2$, $A^3$, $A^4$, $A^5$, and $A^6$ each independently denote a hydrogen atom, a methyl group, or an ethyl group; $Q^1$ denotes a divalent organic group; $R^1$ denotes a tetravalent organic group including a C6-C40 aromatic ring structure; and $L^1$ and $L^2$ each independently denote a hydrogen atom or a C1-C10 alkyl group optionally substituted with a hydroxy group and optionally interrupted by an oxygen atom.

Examples of the C6-C40 aromatic ring structures include those aromatic ring structures derived from benzene, naphthalene, anthracene, acenaphthene, fluorene, triphenylene, phenalene, phenanthrene, indene, indane, indacene, pyrene, chrysene, perylene, naphthacene, pentacene, coronene, heptacene, benzo[a]anthracene, dibenzophenanthrene, and dibenzo[a,j]anthracene.

$R^1$ may be represented by the following formula (III):

[Chem. 5]

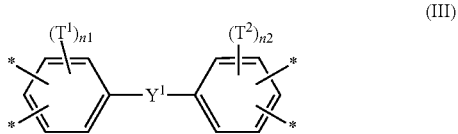

(III)

wherein, in formula (III), $Y^1$ denotes a single bond, an oxygen atom, a sulfur atom, a C1-C10 alkylene group optionally substituted with a halogen atom or a C6-C40 aryl group, or a sulfonyl group; n1 quantity of $T^1$ and n2 quantity of $T^2$ each independently denote a hydrogen atom or a C1-C10 alkyl group, and are optionally bonded to each other to bridge the two benzene rings; n1 and n2 each independently denote an integer of 0 to 4; and

* is a bond to the carbon atom of the carbonyl group to which $R^1$ is bonded.

$Y^1$ is preferably a sulfonyl group.

Examples of the halogen atoms include fluorine, chlorine, iodine, and bromine. It is preferable that $Y^1$ be a sulfonyl group, and $T^1$ and $T^2$ be hydrogen atoms.

Examples of the C6-C40 aryl groups include phenyl group, o-methylphenyl group, m-methylphenyl group, p-methylphenyl group, o-chlorophenyl group, m-chlorophenyl group, p-chlorophenyl group, o-fluorophenyl group, p-fluorophenyl group, o-methoxyphenyl group, p-methoxyphenyl group, p-nitrophenyl group, p-cyanophenyl group, α-naphthyl group, β-biphenylyl group, o-naphthyl group, m-biphenylyl group, p-biphenylyl group, 1-anthryl group, 2-anthryl group, 9-anthryl group, 1-phenanthryl group, 2-phenanthryl group, 3-phenanthryl group, 4-phenanthryl group, and 9-phenanthryl group.

Examples of the C1-C10 alkylene groups include methylene group, ethylene group, n-propylene group, isopropylene group, cyclopropylene group, n-butylene group, isobutylene group, s-butylene group, t-butylene group, cyclobutylene group, 1-methyl-cyclopropylene group, 2-methyl-cyclopropylene group, n-pentylene group, 1-methyl-n-butylene group, 2-methyl-n-butylene group, 3-methyl-n-butylene group, 1,1-dimethyl-n-propylene group, 1,2-dimethyl-n-propylene group, 2,2-dimethyl-n-propylene, 1-ethyl-n-propylene group, cyclopentylene group, 1-methyl-cyclobutylene group, 2-methyl-cyclobutylene group, 3-methyl-cyclobutylene group, 1,2-dimethyl-cyclopropylene group, 2,3-dimethyl-cyclopropylene group, 1-ethyl-cyclopropylene group, 2-ethyl-cyclopropylene group, n-hexylene group, 1-methyl-n-pentylene group, 2-methyl-n-pentylene group, 3-methyl-n-pentylene group, 4-methyl-n-pentylene group, 1,1-dimethyl-n-butylene group, 1,2-dimethyl-n-butylene group, 1,3-dimethyl-n-butylene group, 2,2-dimethyl-n-butylene group, 2,3-dimethyl-n-butylene group, 3,3-dimethyl-n-butylene group, 1-ethyl-n-butylene group, 2-ethyl-n-butylene group, 1,1,2-trimethyl-n-propylene group, 1,2,2-trimethyl-n-propylene group, 1-ethyl-1-methyl-n-propylene group, 1-ethyl-2-methyl-n-propylene group, cyclohexylene group, 1-methyl-cyclopentylene group, 2-methyl-cyclopentylene group, 3-methyl-cyclopentylene group, 1-ethyl-cyclobutylene group, 2-ethyl-cyclobutylene group, 3-ethyl-cyclobutylene group, 1,2-dimethyl-cyclobutylene group, 1,3-dimethyl-cyclobutylene group, 2,2-dimethyl-cyclobutylene group, 2,3-dimethyl-cyclobutylene group, 2,4-dimethyl-cyclobutylene group, 3,3-dimethyl-cyclobutylene group, 1-n-propyl-cyclopropylene group, 2-n-propyl-cyclopropylene group, 1-isopropyl-cyclopropylene group, 2-isopropyl-cyclopropylene group, 1,2,2-trimethyl-cyclopropylene group, 1,2,3-trimethyl-cyclopropylene group, 2,2,3-trimethyl-cyclopropylene group, 1-ethyl-2-methyl-cyclopropylene group, 2-ethyl-1-methyl-cyclopropylene group, 2-ethyl-2-methyl-cyclopropylene group, 2-ethyl-3-methyl-cyclopropylene group, n-heptylene group, n-octylene group, n-nonylene group, and n-decanylene group. Of these, C1-C4 alkyl groups are preferable. The group is preferably selected from methyl group, ethyl group, n-propyl group, i-propyl group, n-butyl group, i-butyl group, s-butyl group, and t-butyl group, and is preferably a methyl group or an ethyl group.

$R^1$ may be derived from a compound represented by the following formula (2-1):

[Chem. 6]

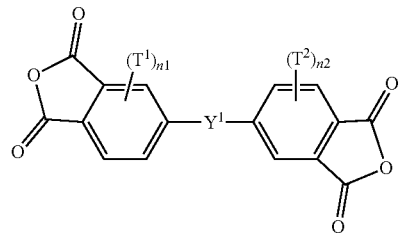

(2-1)

wherein, in formula (2-1), $Y^1$ denotes a single bond, an oxygen atom, a sulfur atom, a C1-C10 alkylene group optionally substituted with a halogen atom or a C6-C40 aryl group, or a sulfonyl group; n1 quantity of $T^1$ and n2 quantity of $T^2$ each independently denote a hydrogen atom or a C1-C10 alkyl group, and are optionally bonded to each other to bridge the two benzene rings; and n1 and n2 each independently denote an integer of 0 to 4.

The polymer may have a heterocyclic structure. For example, the polymer may be a reaction product formed between a compound represented by formula (2-1) and a compound that contains a heterocyclic ring having two reactive groups reactive with the acid dianhydride present in formula (2-1). When the polymer is such a reaction product, the reaction product contains the heterocyclic structure as a repeating unit structure. Details of the heterocyclic ring will be described later.

$Q^1$ may include a C2-C10 alkenyl or alkynyl group.

$Q^1$ is not limited as long as it is a divalent organic group that produces the advantageous effects of the subject application. $Q^1$ is preferably one derived from a diepoxy-containing compound that contains two epoxy groups. Specific examples include structures derived from the compounds illustrated in (10-a) to (10-k) below.

[Chem. 7]

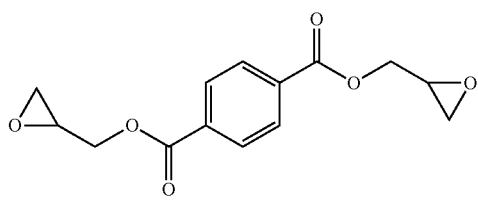

(10-a)

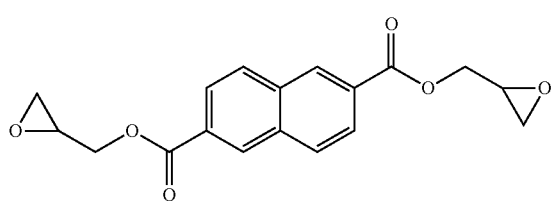

(10-b)

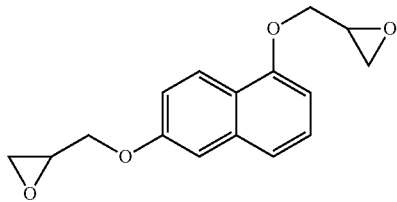

(10-c)

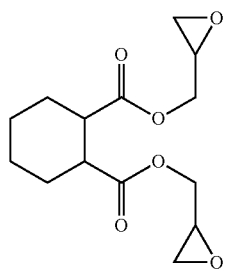

(10-d)

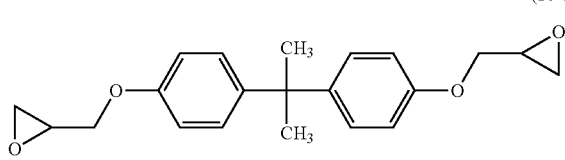

(10-e)

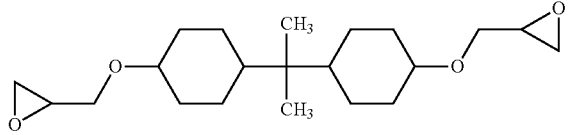

(10-f)

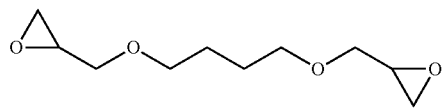

(10-g)

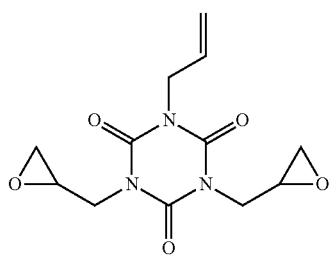

(10-h)

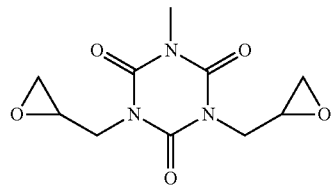

(10-i)

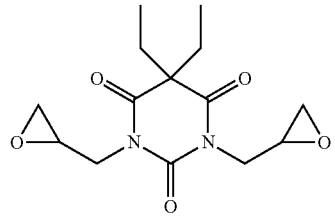

(10-j)

-continued

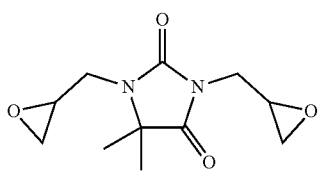
(10-k)

Q¹ may contain a heterocyclic structure. Examples of the heterocyclic structures include furan, thiophene, pyrrole, imidazole, pyran, pyridine, pyrimidine, pyrazine, pyrrolidine, piperidine, piperazine, morpholine, indole, purine, quinoline, isoquinoline, quinuclidine, chromene, thianthrene, phenothiazine, phenoxazine, xanthene, acridine, phenazine, carbazole, triazineone, triazinedione, triazinetrione, and the heterocyclic structures illustrated in (10-h) to (10-k) above. Of these, triazinetrione is preferable. Specifically, the structures illustrated in formulas (10-h) to (10-k) above are preferable.

The polymer may contain a partial structure represented by the following formula (a-1):

[Chem. 8]

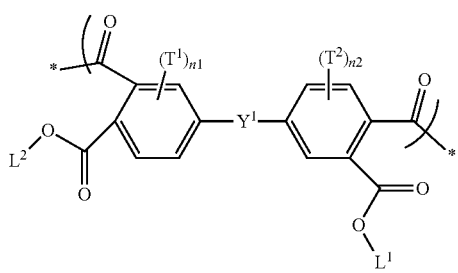
(a-1)

wherein, in formula (a-1), $Y^1$, $T^1$, $T^2$, n1, and n2 are the same as defined hereinabove; $L^1$ and $L^2$ each independently denote a hydrogen atom or a C1-C10 alkyl group optionally substituted with a hydroxy group and optionally interrupted by an oxygen atom; and * denotes a bond to the polymer residue).

$L^1$ and $L^2$ are each preferably a C1-C10 alkyl group substituted with a hydroxy group and interrupted by an oxygen atom. The phrase that a C1-C10 alkyl group is optionally interrupted by an oxygen atom means that the alkyl group may include an ether bond in-between one, or two or more carbon-carbon bonds. For example, as illustrated in Synthesis Examples according to the section of Examples, the structures of $L^1$ and $L^2$ may preferably result from the reaction of a solvent used in the reaction (for example, a solvent represented by (3d-1) or (3d-2) below) with the carboxyl groups derived from compound (a).

[Chem. 9]

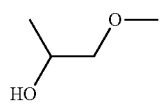
(3d-1)

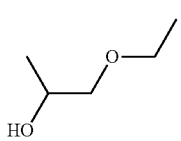
(3d-2)

The polymer may contain a repeating unit represented by the following formula (a-2):

[Chem. 10]

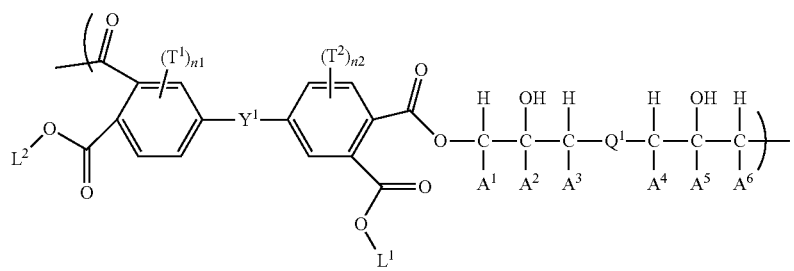
(a-2)

wherein, in formula (a-2), $Y^1$, $T^1$, $T^2$, n1, and n2 are the same as defined hereinabove; $L^1$ and $L^2$ are the same as defined above; $A^1$, $A^2$, $A^3$, $A^4$, $A^5$, and $A^6$ each independently denote a hydrogen atom, a methyl group, or an ethyl group; and $Q^1$ denotes a divalent organic group.

The weight average molecular weight of the polymer is preferably within the range of 500 to 50,000, and more preferably 1,000 to 30,000. For example, the weight average molecular weight may be measured by the gel permeation chromatography method according to Examples.

The proportion of the polymer contained in the whole of the resist underlayer film-forming composition of the present invention is usually within the range of 0.05% by mass to 3.0% by mass, or 0.08% by mass to 2.0% by mass, or 0.1% by mass to 1.0% by mass.

Examples of the organic solvents contained in the resist underlayer film-forming compositions of the present invention include ethylene glycol monomethyl ether, ethylene glycol monoethyl ether, methylcellosolve acetate, ethylcellosolve acetate, diethylene glycol monomethyl ether, diethylene glycol monoethyl ether, propylene glycol, propylene glycol monomethyl ether, propylene glycol monoethyl ether, propylene glycol monomethyl ether acetate, propylene glycol propyl ether acetate, toluene, xylene, methyl ethyl ketone, methyl isobutyl ketone, cyclopentanone, cyclohexanone, cycloheptanone, 4-methyl-2-pentanol, methyl 2-hydroxyisobutyrate, ethyl 2-hydroxyisobutyrate, ethyl ethoxyacetate, 2-hydroxyethyl acetate, methyl 3-methoxypropionate, ethyl 3-methoxypropionate, ethyl 3-ethoxypropionate, methyl 3-ethoxypropionate, methyl pyruvate, ethyl pyruvate, ethyl acetate, butyl acetate, ethyl lactate, butyl lactate, 2-heptanone, methoxycyclopentane, anisole, γ-butyrolactone, N-methylpyrrolidone, N,N-dimethylformamide, and N,N-dimethylacetamide. The solvents may be used each alone or in combination of two or more thereof.

Of the solvents mentioned above, for example, propylene glycol monomethyl ether, propylene glycol monomethyl ether acetate, ethyl lactate, butyl lactate, and cyclohexanone are preferable. In particular, propylene glycol monomethyl ether and propylene glycol monomethyl ether acetate are preferable.

An end of the polymer may be capped with a compound.

The compound may contain an optionally substituted aliphatic ring.

The aliphatic ring is preferably a C3-C10 monocyclic or polycyclic aliphatic ring. Examples of the C3-C10 monocyclic or polycyclic aliphatic rings include cyclopropane, cyclobutane, cyclopentane, cyclohexane, cyclohexene, cycloheptane, cyclooctane, cyclononane, cyclodecane, spirobicyclopentane, bicyclo[2.1.0]pentane, bicyclo[3.2.1]octane, tricyclo[3.2.1.0$^{2,7}$]octane, spiro[3,4]octane, norbornane, norbornene, and tricyclo[3.3.1.1$^{3,7}$] decane (adamantane).

The polycyclic aliphatic ring is preferably a bicyclo ring or a tricyclo ring.

Examples of the bicyclo rings include norbornane, norbornene, spirobicyclopentane, bicyclo[2.1.0]pentane, bicyclo[3.2.1]octane, and spiro[3,4]octane.

Examples of the tricyclo rings include tricyclo[3.2.1.0$^{2,7}$] octane and tricyclo[3.3.1.1$^{3,7}$] decane (adamantane).

The term "optionally substituted aliphatic ring" means that the aliphatic ring is optionally substituted with a substituent enumerated below in place of one or more hydrogen atoms.

The substituent is preferably selected from a hydroxy group, a linear or branched C1-C10 alkyl group, a C1-C20 alkoxy group, a C1-C10 acyloxy group optionally interrupted by an oxygen atom, and a carboxyl group.

Examples of the C1-C20 alkoxy groups include methoxy group, ethoxy group, n-propoxy group, i-propoxy group, n-butoxy group, i-butoxy group, s-butoxy group, t-butoxy group, n-pentyloxy group, 1-methyl-n-butoxy group, 2-methyl-n-butoxy group, 3-methyl-n-butoxy group, 1,1-dimethyl-n-propoxy group, 1,2-dimethyl-n-propoxy group, 2,2-dimethyl-n-propoxy group, 1-ethyl-n-propoxy group, n-hexyloxy group, 1-methyl-n-pentyloxy group, 2-methyl-n-pentyloxy group, 3-methyl-n-pentyloxy group, 4-methyl-n-pentyloxy group, 1,1-dimethyl-n-butoxy group, 1,2-dimethyl-n-butoxy group, 1,3-dimethyl-n-butoxy group, 2,2-dimethyl-n-butoxy group, 2,3-dimethyl-n-butoxy group, 3,3-dimethyl-n-butoxy group, 1-ethyl-n-butoxy group, 2-ethyl-n-butoxy group, 1,1,2-trimethyl-n-propoxy group, 1,2,2-trimethyl-n-propoxy group, 1-ethyl-1-methyl-n-propoxy group, 1-ethyl-2-methyl-n-propoxy group, cyclopentyloxy group, cyclohexyloxy group, norbornyloxy group, adamantyloxy group, adamantanemethyloxy group, adamantaneethyloxy group, tetracyclodecanyloxy group, and tricyclodecanyloxy group.

The aliphatic ring preferably has at least one unsaturated bond (for example, double bond or triple bond). The aliphatic ring preferably has one to three unsaturated bonds. The aliphatic ring preferably has one or two unsaturated bonds. The unsaturated bond is preferably a double bond.

Specific examples of the compounds that contain an optionally substituted aliphatic ring include compounds illustrated below. The carboxyl groups in the following specific examples may be replaced by hydroxy groups, amino groups, or thiol groups, and the resultant compounds are also constitute specific examples.

[Chem. 11]

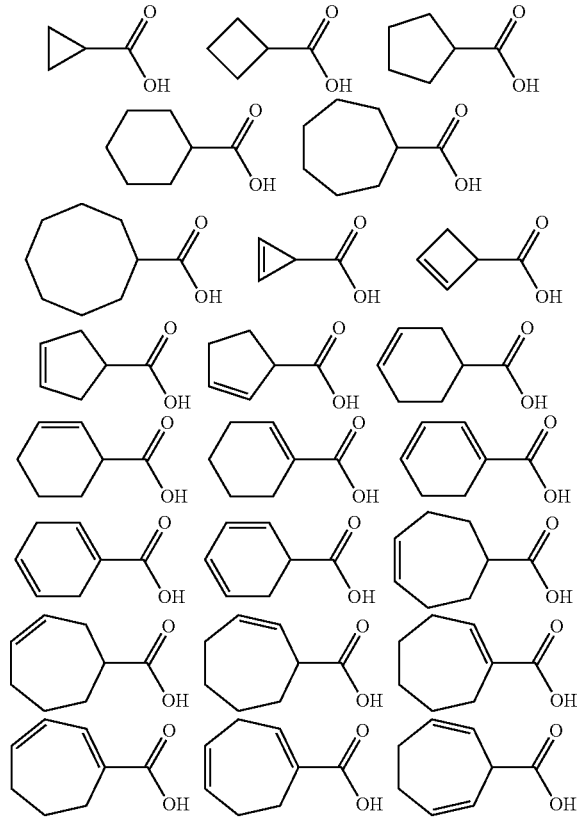

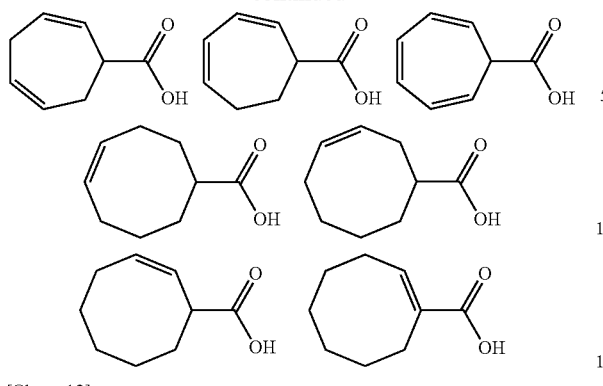
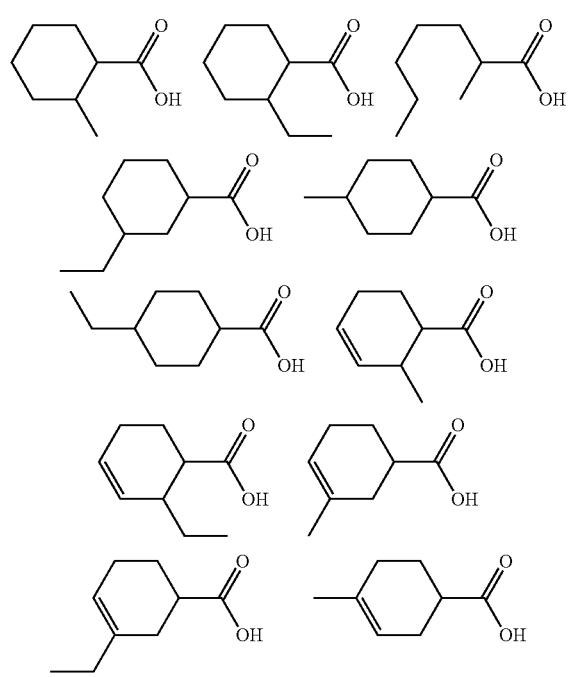
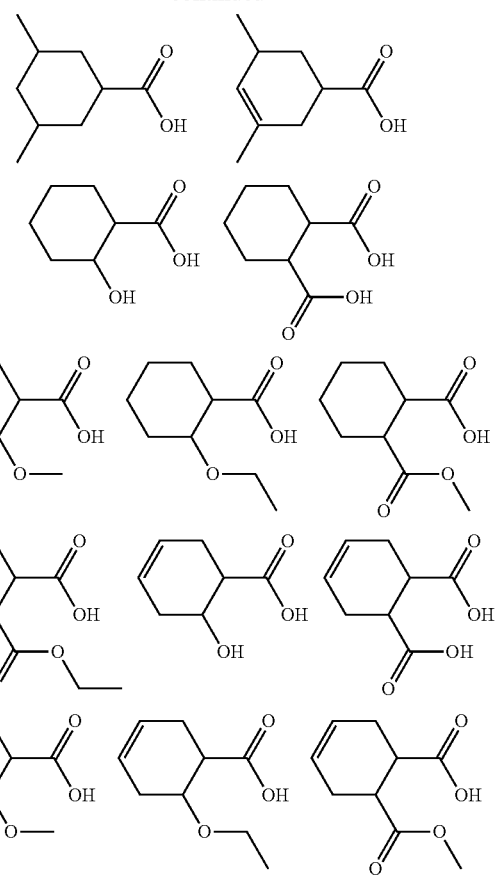
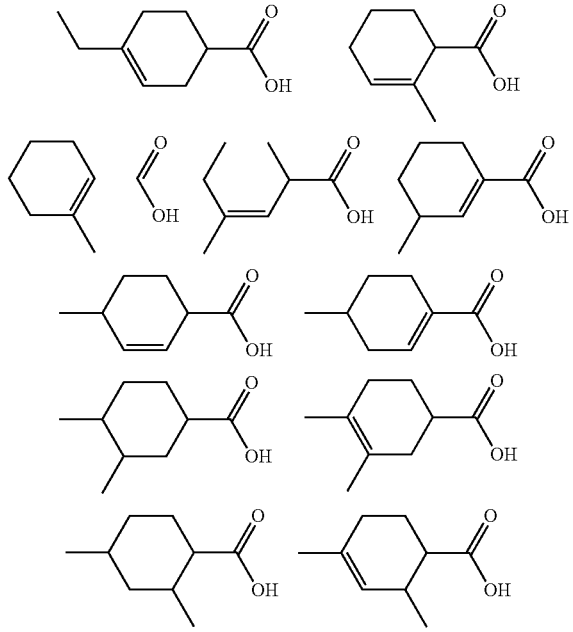

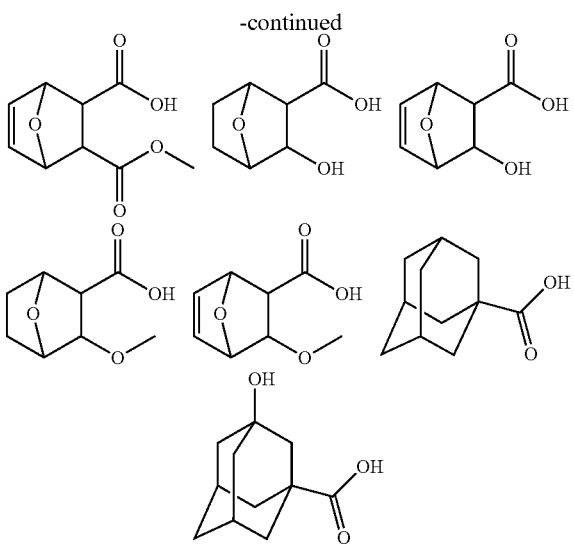

The polymers terminated with an optionally substituted aliphatic ring are disclosed in WO 2020/226141, the entire contents of which are incorporated herein by reference.

The compound may be represented by formula (1) and formula (2) below:

[Chem. 14]

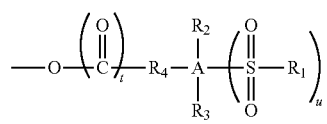

(1)

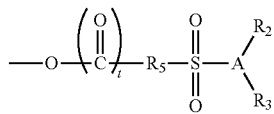

(2)

wherein, in formulas (1) and (2), $R_1$ denotes a C1-C6 alkyl group, a phenyl group, a pyridyl group, a halogeno group, or a hydroxy group, and optionally has a substituent; $R_2$ denotes a hydrogen atom, a C1-C6 alkyl group, a hydroxy group, a halogeno group, or an ester group represented by —C(=O)O—X where X denotes an optionally substituted C1-C6 alkyl group; $R_3$ denotes a hydrogen atom, a C1-C6 alkyl group, a hydroxy group, or a halogeno group; $R_4$ denotes a direct bond or a C1-C8 divalent organic group; $R_5$ denotes a C1-C8 divalent organic group; A denotes an aromatic ring or an aromatic heterocyclic ring; t denotes 0 or 1; and u denotes 1 or 2.

The polymer end structures represented by formula (1) and formula (2) may be produced by reacting the polymer with a compound represented by formula (1a) below and/or a compound represented by formula (2a) below.

[Chem. 15]

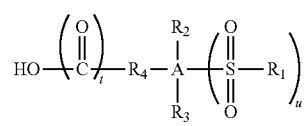

(1a)

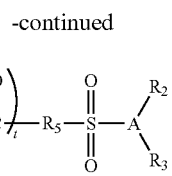

(2a)

wherein the meanings of the symbols in formulas (1a) and (2a) are the same as according to formulas (1) and (2) hereinabove.

Examples of the compounds represented by formula (1a) include compounds represented by the following formulas:

[Chem. 16]

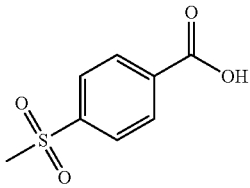

(1a-1)

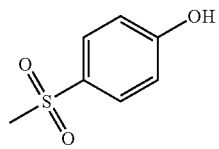

(1a-2)

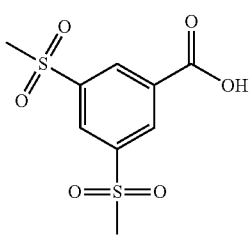

(1a-3)

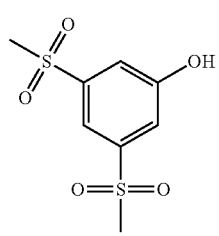

(1a-4)

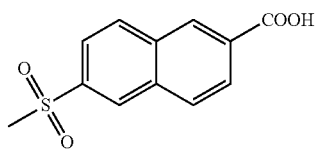

(1a-5)

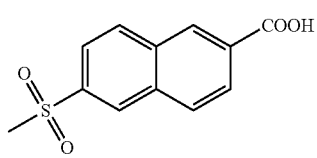

(1a-6)

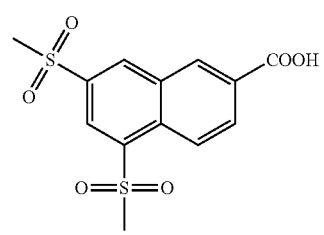
(1a-7)
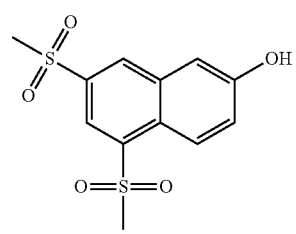
(1a-8)
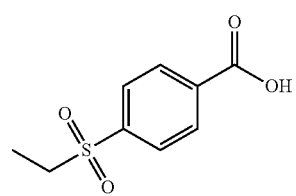
(1a-9)
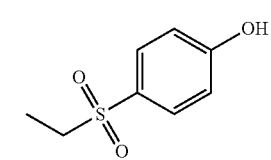
(1a-10)
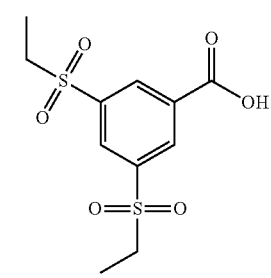
(1a-11)
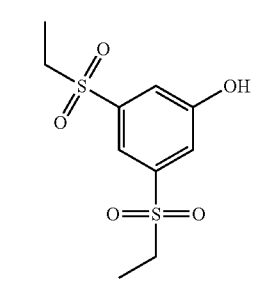
(1a-12)
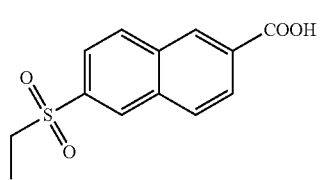
(1a-13)
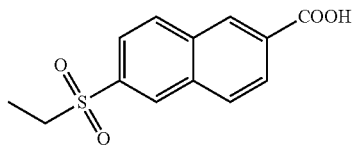
(1a-14)
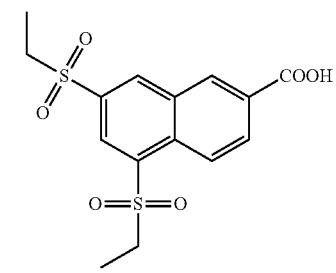
(1a-15)
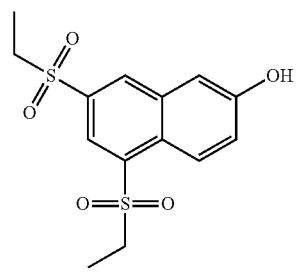
(1a-16)
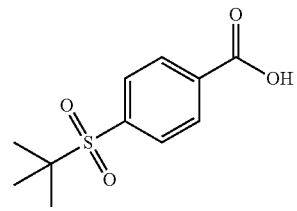
(1a-17)
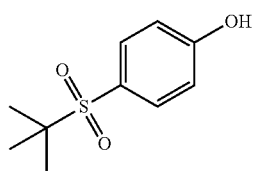
(1a-18)
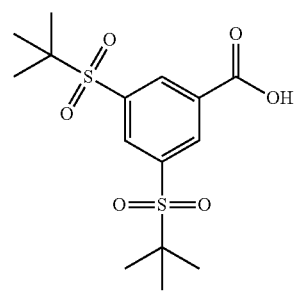
(1a-19)

(1a-20)
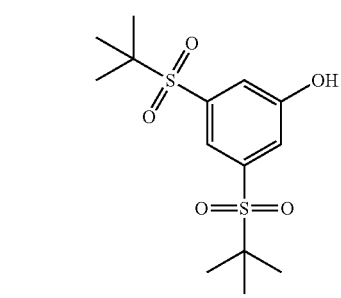
[Chem. 17]
(1a-21)
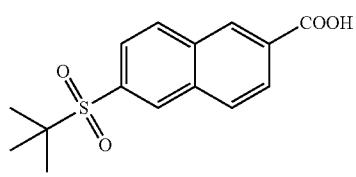
(1a-22)
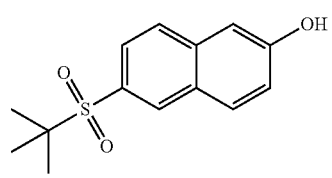
(1a-23)
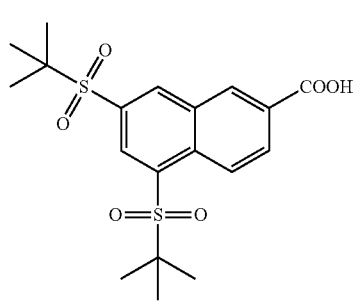
(1a-24)
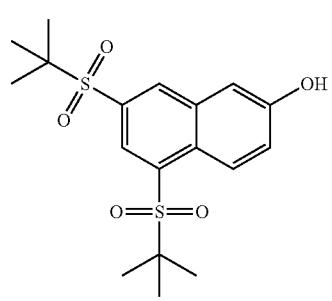
(1a-25)
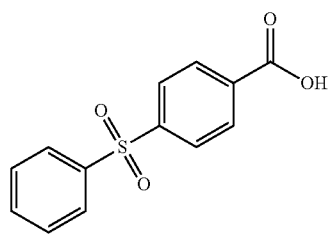
(1a-26)
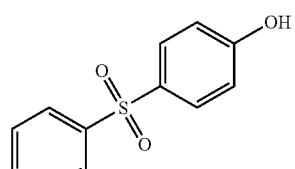
(1a-27)
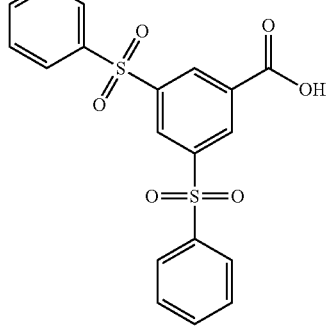
(1a-28)
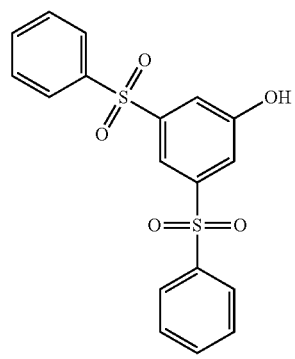
(1a-29)
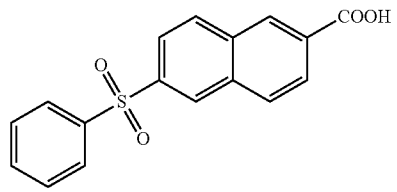
(1a-30)
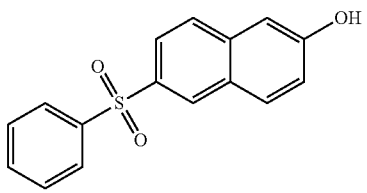

(1a-31)
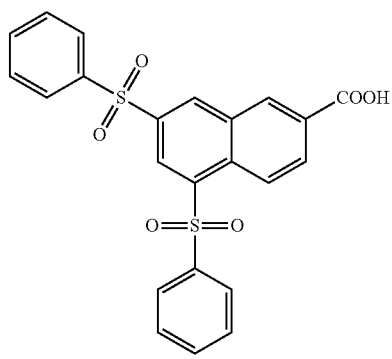
(1a-32)
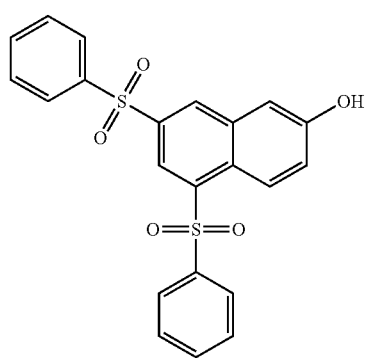
[Chem. 18]
(1a-33)
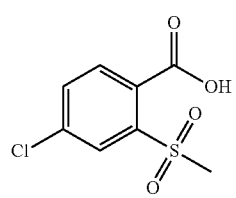
(1a-34)
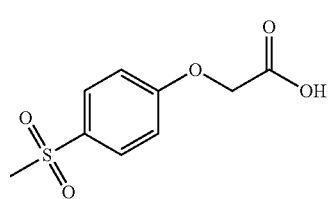
(1a-35)
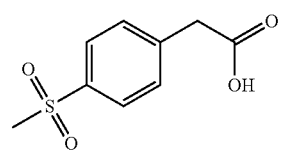
(1a-36)
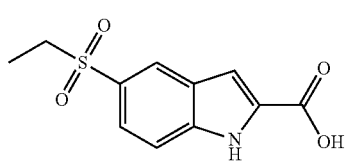
(1a-37)
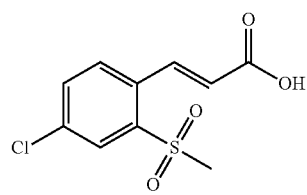
(1a-38)
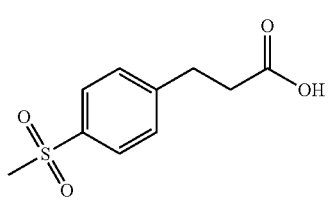
(1a-39)
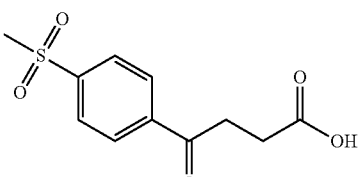
(1a-40)
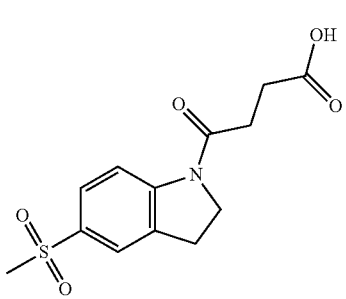
(1a-41)
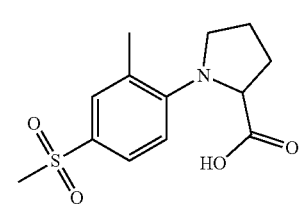
(1a-42)
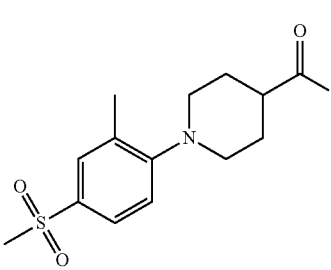
(1a-43)
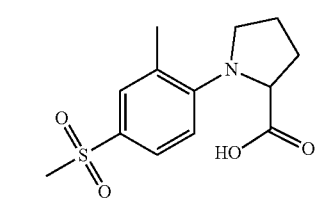

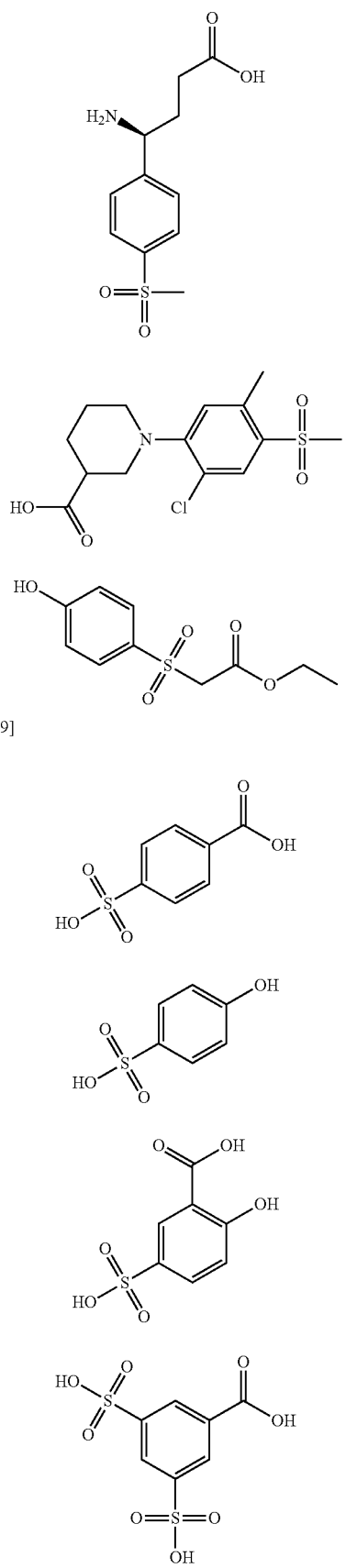
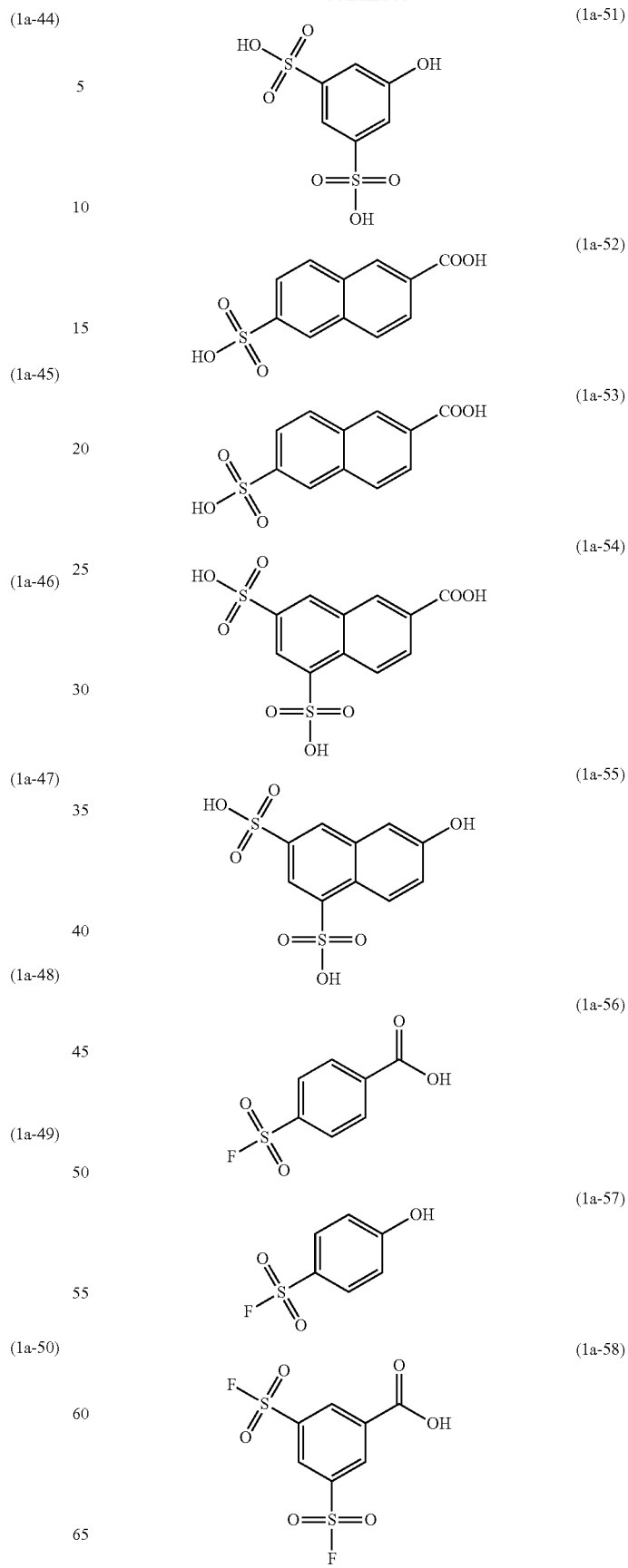

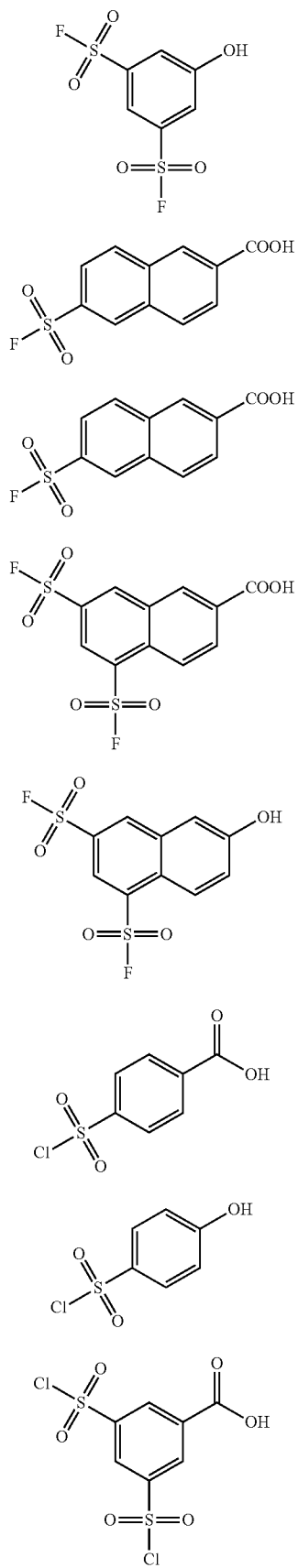

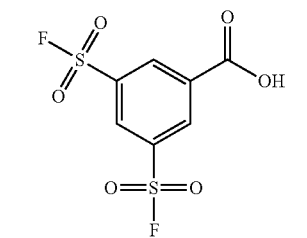
(1a-74)
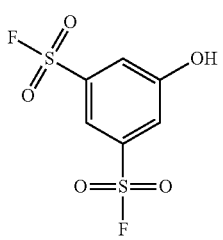
(1a-75)
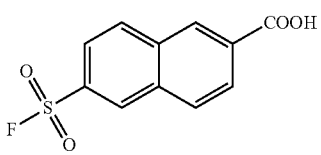
(1a-76)
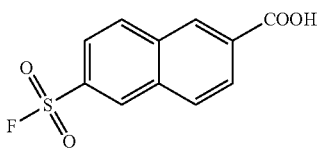
(1a-77)
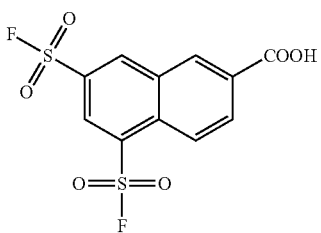
(1a-78)
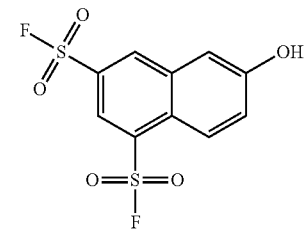
(1a-79)
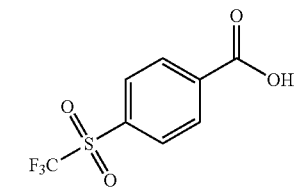
(1a-80)
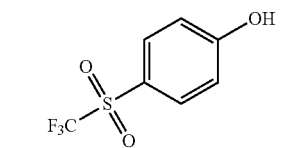
(1a-81)
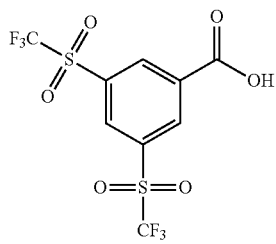
(1a-82)
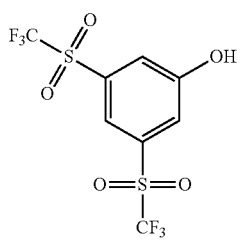
(1a-83)
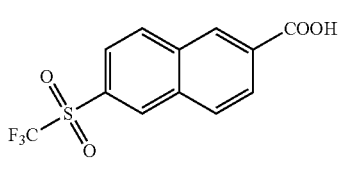
(1a-84)
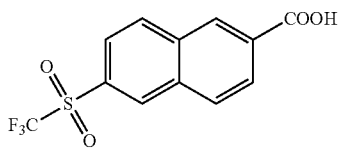
(1a-85)
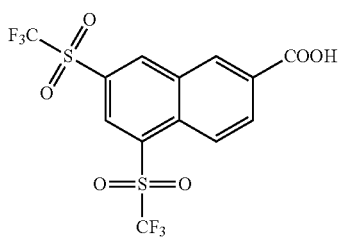
(1a-86)
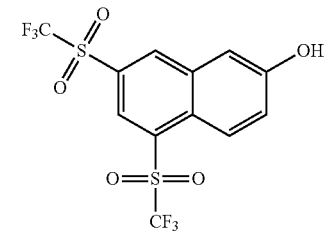
(1a-87)

Examples of the compounds represented by formula (2a) include compounds represented by the following formulas:

[Chem. 21]

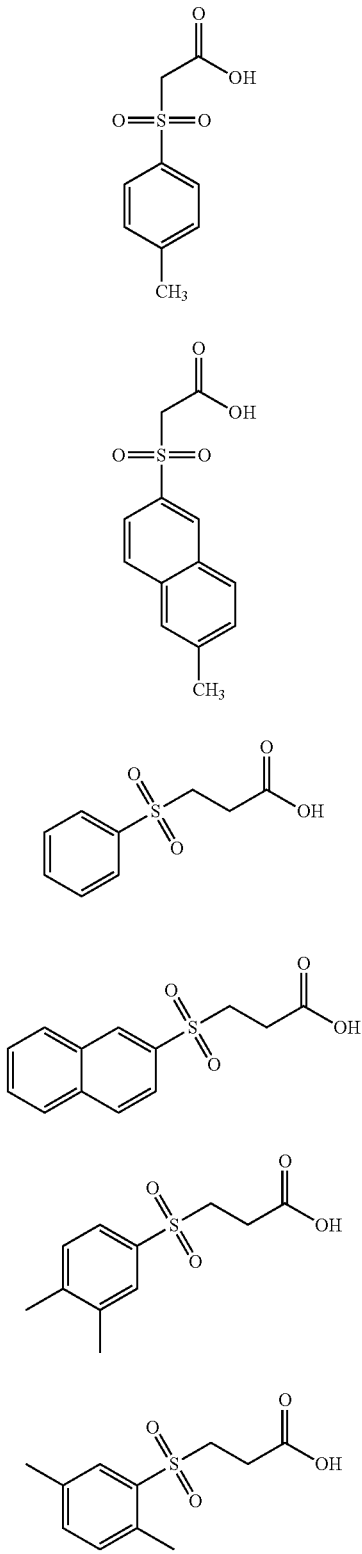

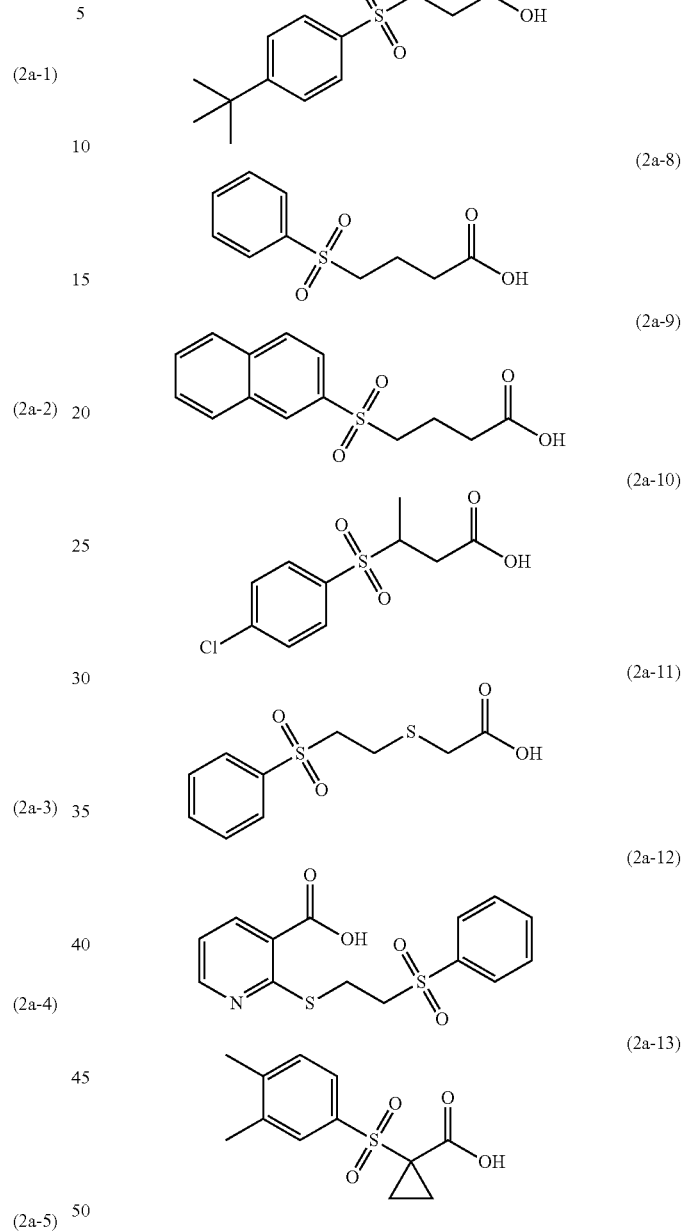

Formulas (1) and (2) are disclosed in WO 2015/163195, the entire contents of which are incorporated herein by reference.

<Curing Catalysts>

The resist underlayer film-forming composition of the present invention may include a curing catalyst, preferably an acid generator, as an optional component. Examples of the acid generators include sulfonic acid compounds and carboxylic acid compounds, such as p-toluenesulfonic acid, trifluoromethanesulfonic acid, pyridinium-p-toluenesulfonate (pyridinium-p-toluenesulfonic acid), pyridinium-p-hydroxybenzenesulfonic acid (pyridinium p-phenolsulfonate salt), pyridinium-trifluoromethanesulfonic acid, salicylic acid, camphorsulfonic acid, 5-sulfosalicylic acid, 4-chlorobenzenesulfonic acid, 4-hydroxybenzenesulfonic acid, benzenedisulfonic acid, 1-naphthalenesulfonic acid, citric acid, benzoic acid, and hydroxybenzoic acid. When the crosslinking catalyst is used, the content of the crosslinking catalyst is, for example, within the range of 0.1% by mass to 50% by mass, and preferably 1% by mass to 30% by mass, relative to a crosslinking agent described below.

Crosslinking Agents

The resist underlayer film-forming composition of the present invention may include a crosslinking agent as an optional component. Examples thereof include hexamethoxymethylmelamine, tetramethoxymethylbenzoguanamine, 1,3,4,6-tetrakis(methoxymethyl)glycoluril (tetramethoxymethylglycoluril) (POWDERLINK [registered trademark] 1174), 1,3,4,6-tetrakis(butoxymethyl)glycoluril, 1,3,4,6-tetrakis(hydroxymethyl)glycoluril, 1,3-bis(hydroxymethyl)urea, 1,1,3,3-tetrakis(butoxymethyl)urea, and 1,1,3,3-tetrakis(methoxymethyl)urea.

Furthermore, the crosslinking agents in the subject application may be nitrogen-containing compounds according to WO 2017/187969 that have in the molecule 2 to 6 substituents represented by formula (1d) below which are bonded to nitrogen atoms.

[Chem. 22]

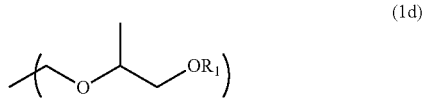

(1d)

(In formula (1d), $R_1$ denotes a methyl group or an ethyl group.)

The nitrogen-containing compounds that have in the molecule 2 to 6 substituents represented by formula (1d) may be glycoluril derivatives represented by formula (1E) below:

[Chem. 23]

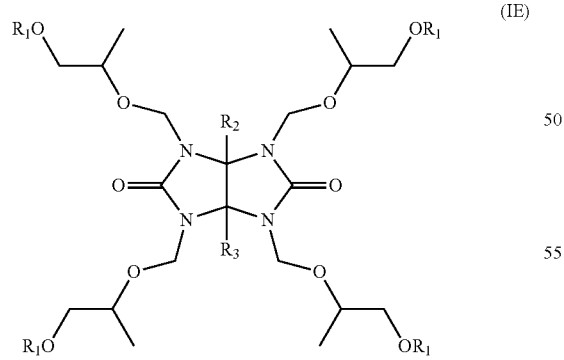

(1E)

(in formula (1E), the four $R_1$s each independently denote a methyl group or an ethyl group; and $R_2$ and $R_3$ each independently denote a hydrogen atom, a C1-C4 alkyl group, or a phenyl group).

Examples of the glycoluril derivatives represented by formula (1E) include compounds represented by the following formulas (1E-1) to (1E-6):

[Chem. 24]

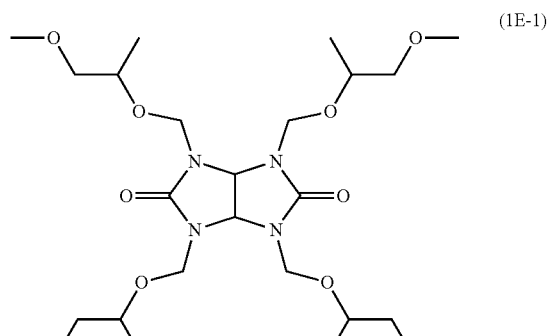

(1E-1)

(1E-2)

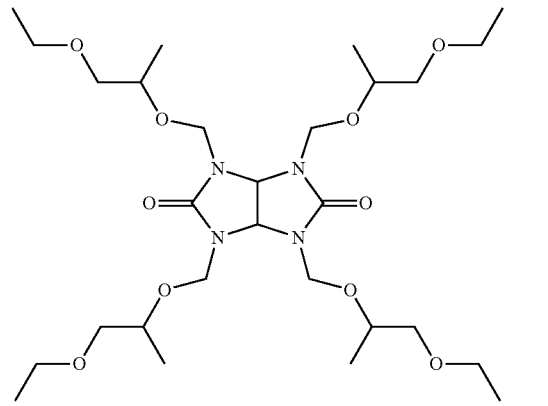

(1E-3)

(1E-4)

-continued (1E-5)

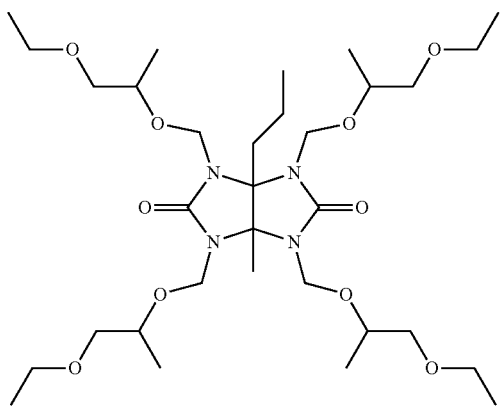

(1E-6)

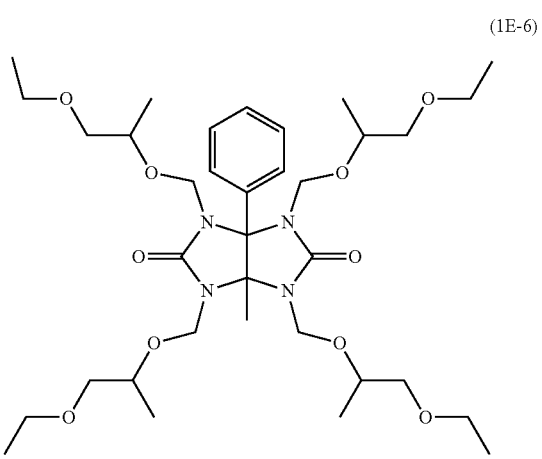

The nitrogen-containing compound that has in the molecule 2 to 6 substituents represented by formula (1d) is obtained by reacting a nitrogen-containing compound that has in the molecule 2 to 6 substituents represented by formula (2d) below which are bonded to nitrogen atoms, with at least one compound represented by formula (3d) below.

[Chem. 25]

(2d)

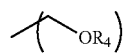

(3d)

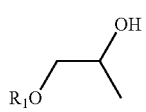

(In formulas (2d) and (3d), $R_1$ denotes a methyl group or an ethyl group; and $R_4$ denotes a C1-C4 alkyl group.)

The glycoluril derivative represented by formula (1E) is obtained by reacting a glycoluril derivative represented by formula (2E) below with at least one compound represented by the above formula (3d).

For example, the nitrogen-containing compound that has in the molecule 2 to 6 substituents represented by formula (2d) is a glycoluril derivative represented by formula (2E) below:

[Chem. 26]

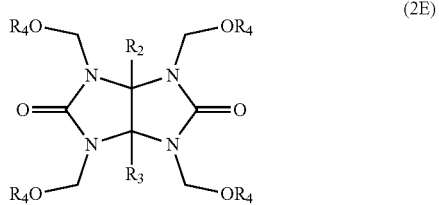

(2E)

(in formula (2E), $R_2$ and $R_3$ each independently denote a hydrogen atom, a C1-C4 alkyl group, or a phenyl group; and $R_4$ independently at each occurrence denotes a C1-C4 alkyl group).

Examples of the glycoluril derivatives represented by formula (2E) include compounds represented by formulas (2E-1) to (2E-4) below. Furthermore, examples of the compounds represented by formula (3d) include compounds represented by formulas (3d-1) and (3d-2) below.

[Chem. 27]

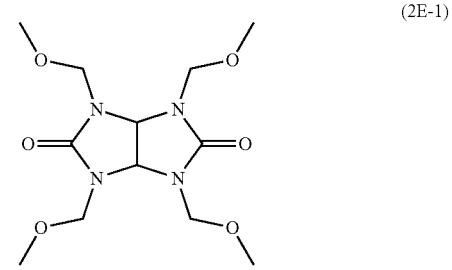

(2E-1)

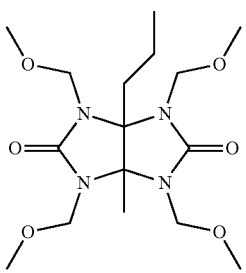

(2E-2)

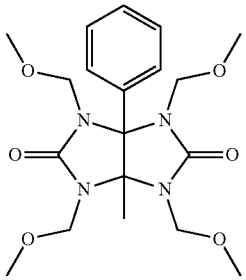

(2E-3)

-continued (2E-4)

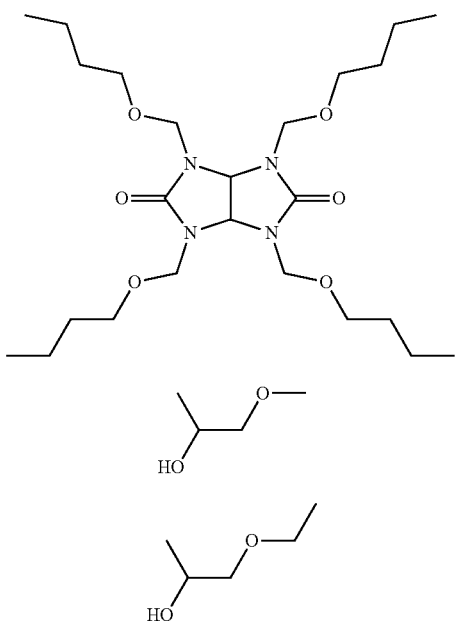

(3d-1)

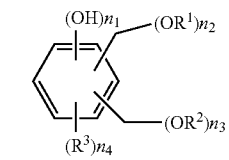

(3d-2)

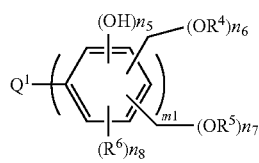

The nitrogen-containing compounds that have in the molecule 2 to 6 substituents represented by formula (1d) which are bonded to nitrogen atoms are disclosed in WO 2017/187969, the entire contents of which are incorporated herein by reference.

Furthermore, the crosslinking agents may be crosslinking compounds of formula (G-1) or formula (G-2) below according to WO 2014/208542.

[Chem. 29]

Formula (G-1)

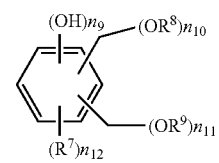

Formula (G-2)

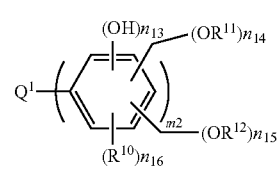

(In the formulas, $Q^1$ denotes a single bond or an m1-valent organic group; $R^1$ and $R^4$ each denote a C2-C10 alkyl group, or a C2-C10 alkyl group having a C1-C10 alkoxy group; $R^2$ and $R^5$ each denote a hydrogen atom or a methyl group; and $R^3$ and $R^6$ each denote a C1-C10 alkyl group or a C6-C40 aryl group.

n1 is an integer of $1 \leq n1 \leq 3$; n2 is an integer of $2 \leq n2 \leq 5$; n3 is an integer of $0 \leq n3 \leq 3$; n4 is an integer of $0 \leq n4 \leq 3$; and $3 \leq (n1+n2+n3+n4) \leq 6$.

n5 is an integer of $1 \leq n5 \leq 3$; n6 is an integer of $1 \leq n6 \leq 4$; n7 is an integer of $0 \leq n7 \leq 3$; n8 is an integer of $0 \leq n8 \leq 3$; and $2 \leq (n5+n6+n7+n8) \leq 5$.

m1 is an integer of 2 to 10.)

The crosslinking compounds represented by formula (G-1) or formula (G-2) may be compounds obtained by reacting a compound represented by formula (G-3) or formula (G-4) below with a hydroxy group-containing ether compound or a C2-C10 alcohol.

[Chem. 30]

Formula (G-3)

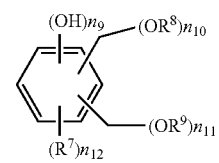

Formula (G-4)

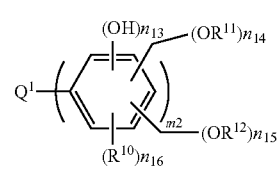

(In the formulas, $Q^2$ denotes a single bond or an m2-valent organic group; $R^8$, $R^9$, $R^{11}$, and $R^{12}$ each denote a hydrogen atom or a methyl group; and $R^7$ and $R^{10}$ each denote a C1-C10 alkyl group or a C6-C40 aryl group.

n9 is an integer of $1 \leq n9 \leq 3$; n10 is an integer of $2 \leq n10 \leq 5$; n11 is an integer of $0 \leq n11 \leq 3$; n12 is an integer of $0 \leq n12 \leq 3$; and $3 \leq (n9+n10+n11+n12) \leq 6$.

n13 is an integer of $1 \leq n13 \leq 3$; n14 is an integer of $1 \leq n14 \leq 4$; n15 is an integer of $0 \leq n15 \leq 3$; n16 is an integer of $0 \leq n16 \leq 3$; and $2 \leq (n13+n14+n15+n16) \leq 5$.

m2 is an integer of 2 to 10.)

Examples of the compounds represented by formulas (G-1) and (G-2) include those illustrated below.

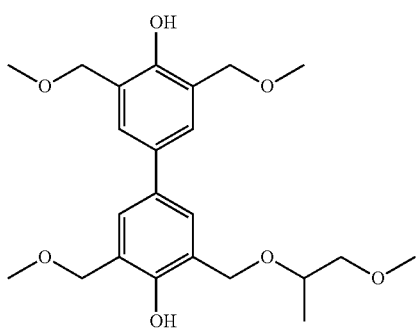

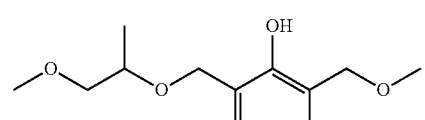

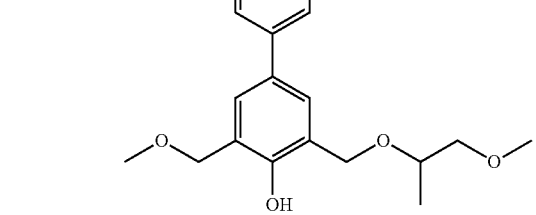

37
-continued
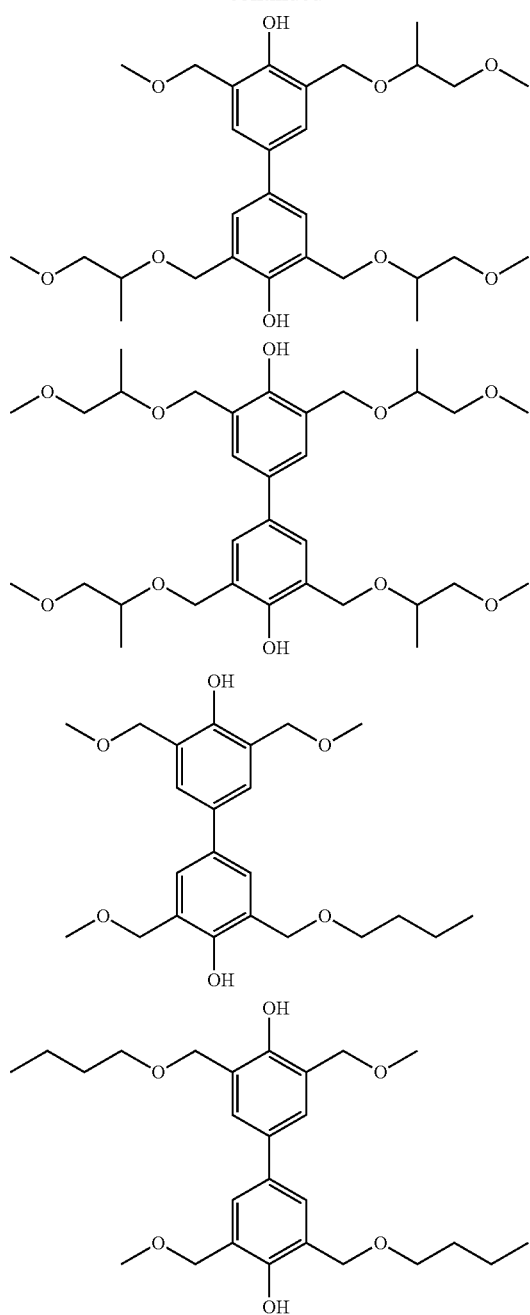
38
-continued
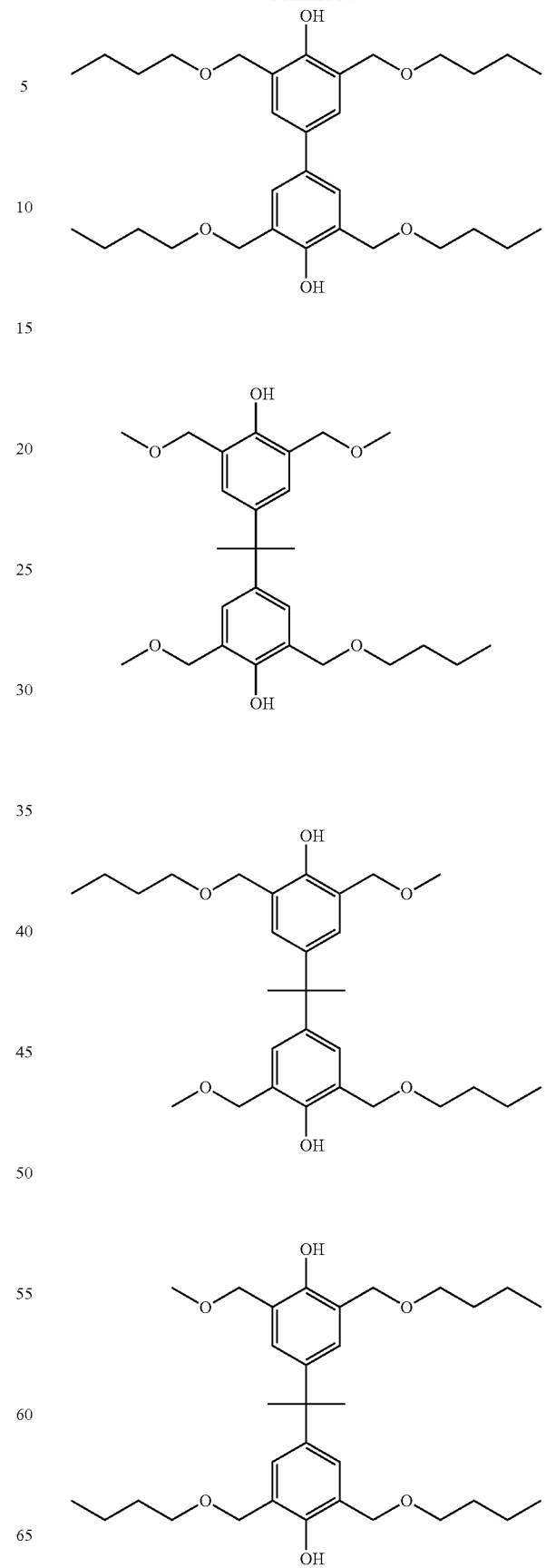

39
-continued
40
-continued
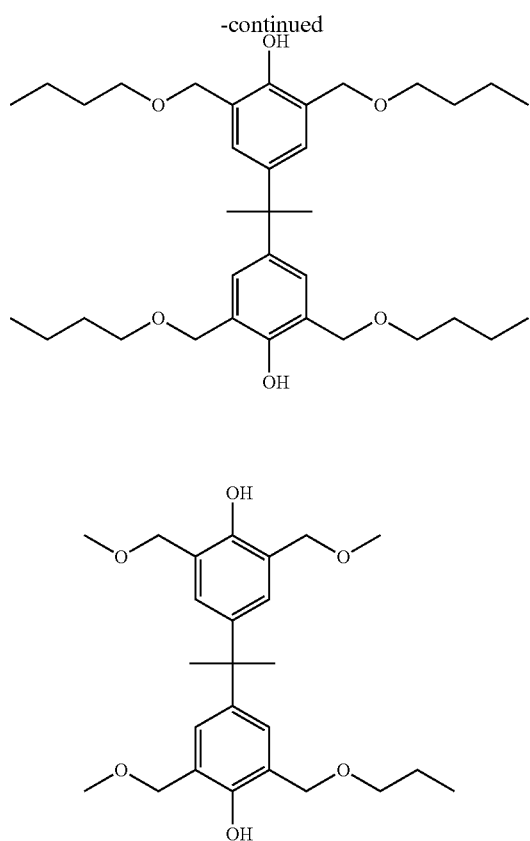
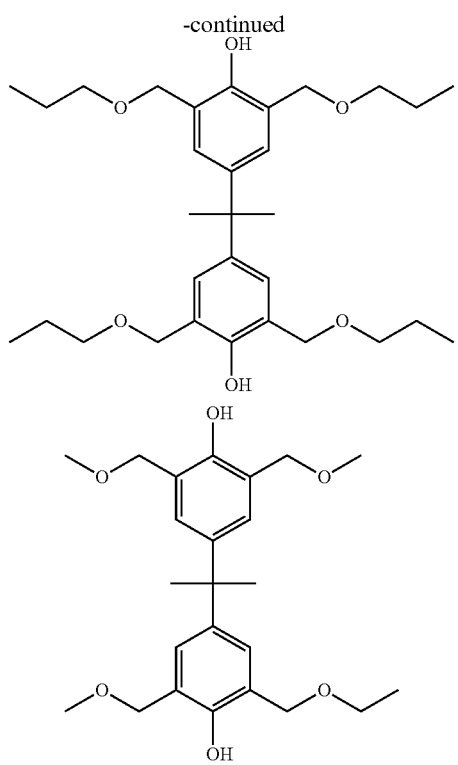
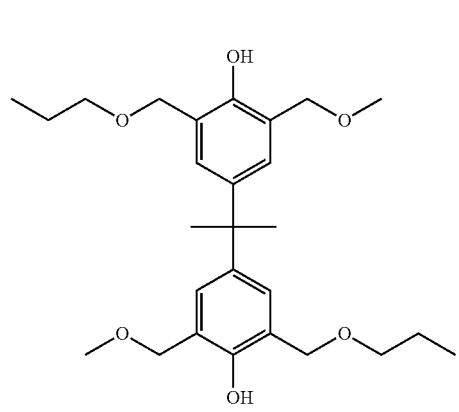
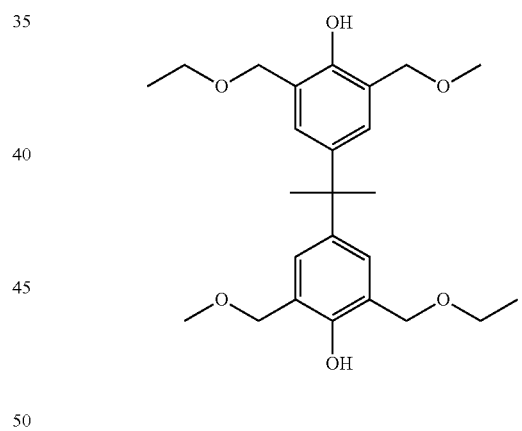
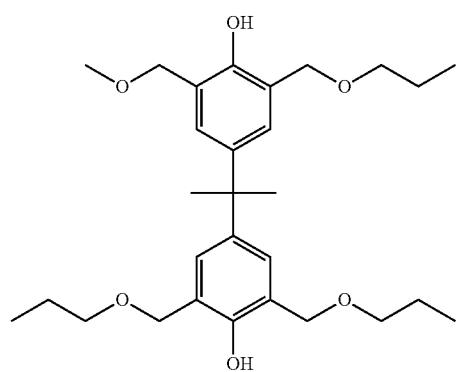
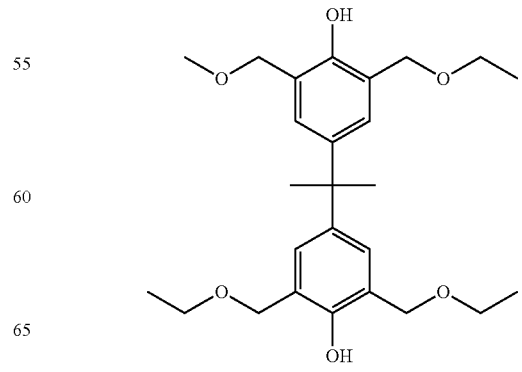

41
-continued
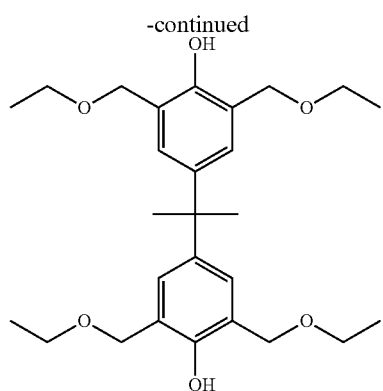
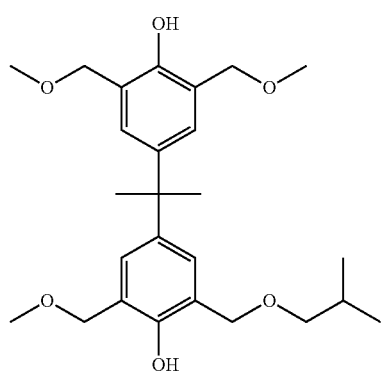
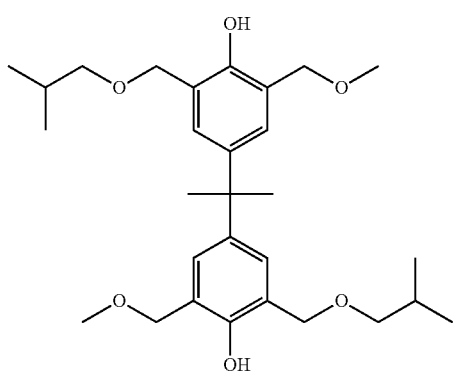
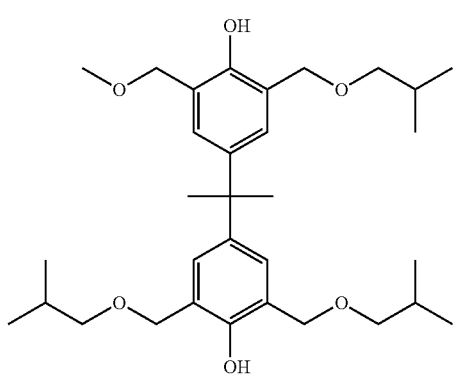
42
-continued
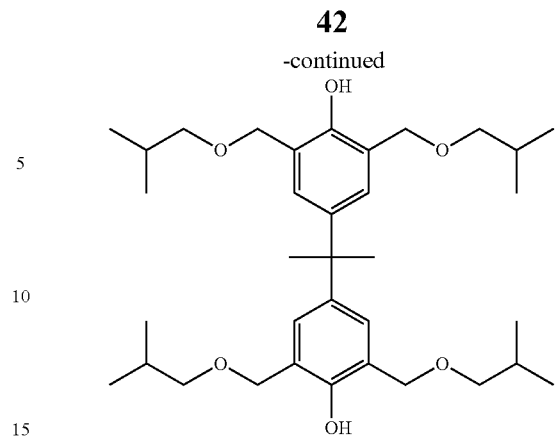
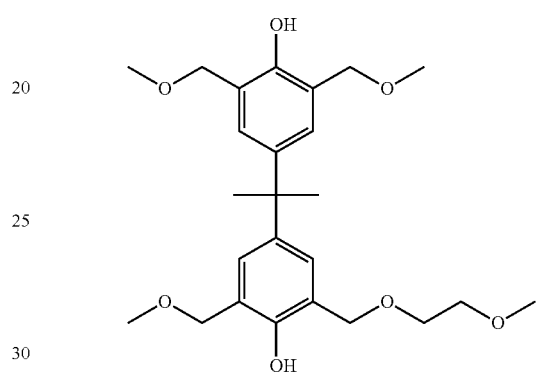
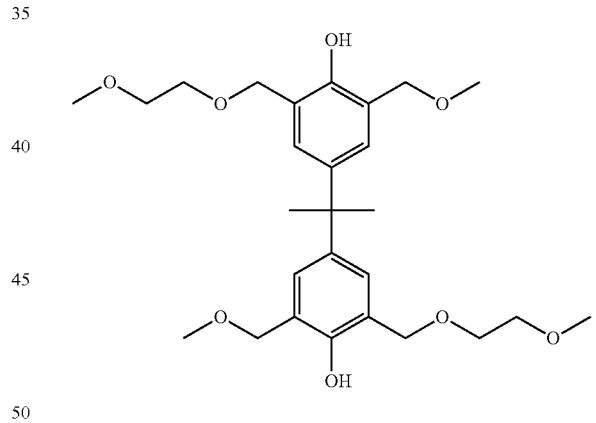
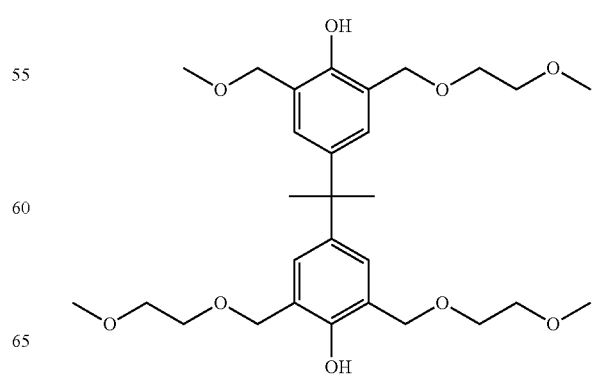

43
-continued
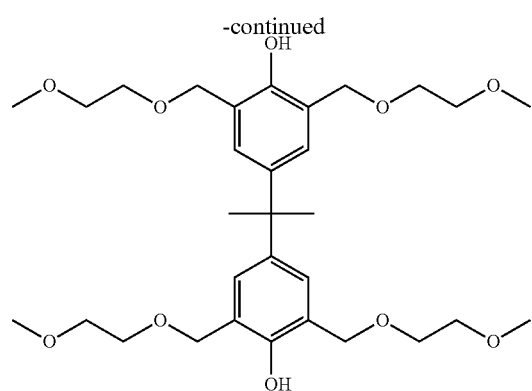
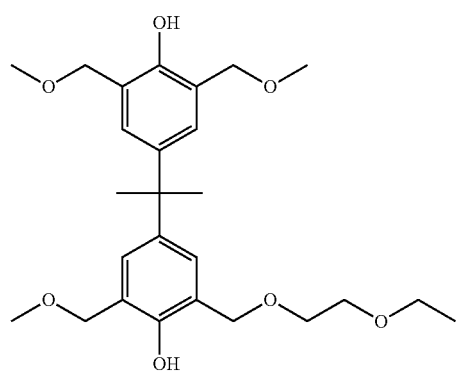
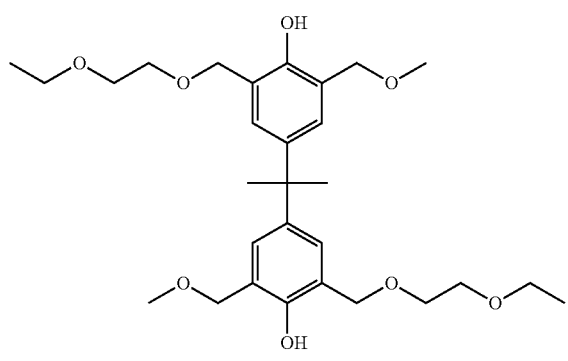
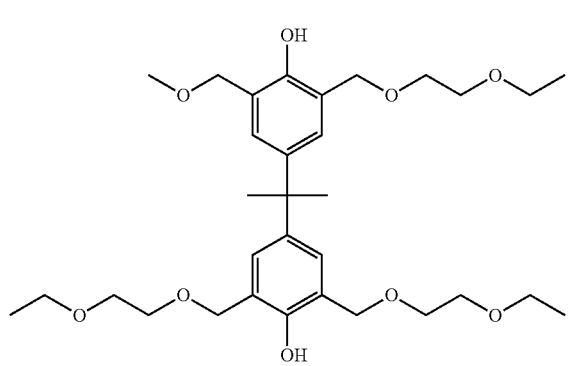
44
-continued
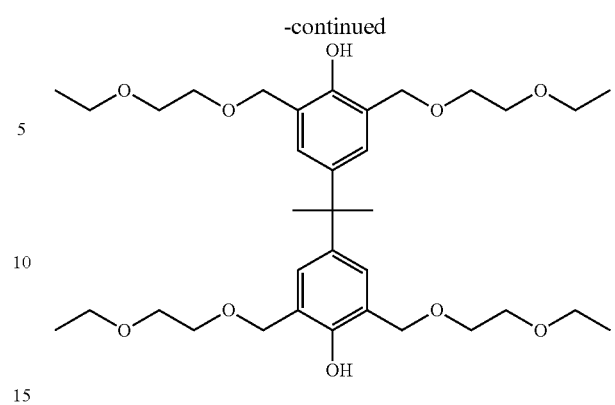
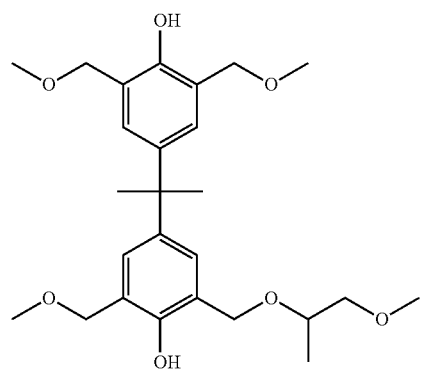
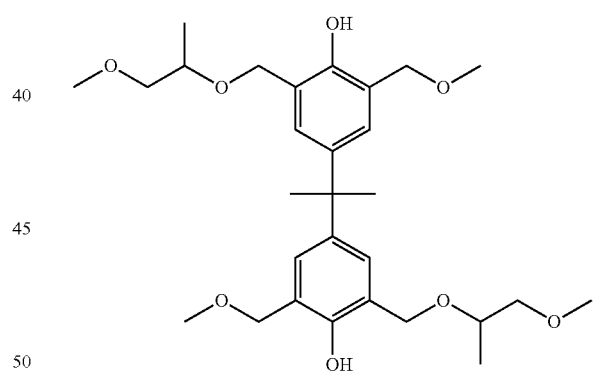
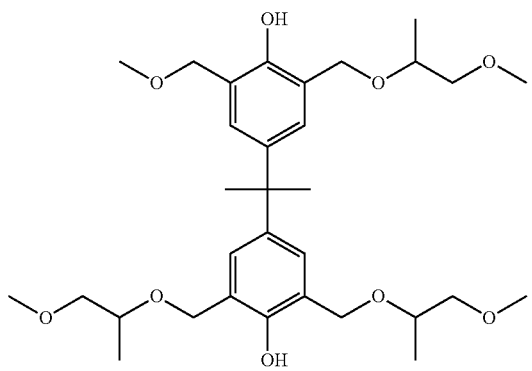

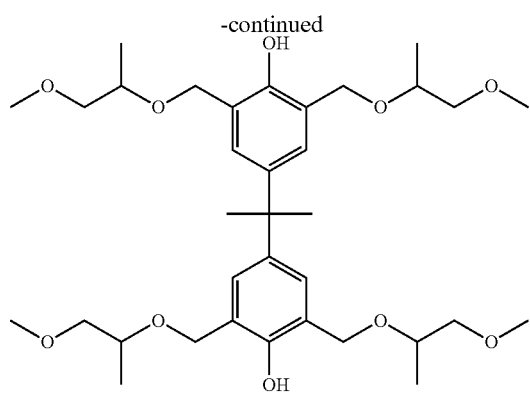
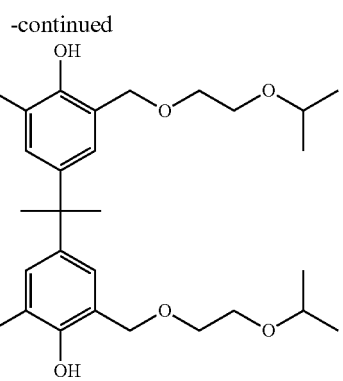
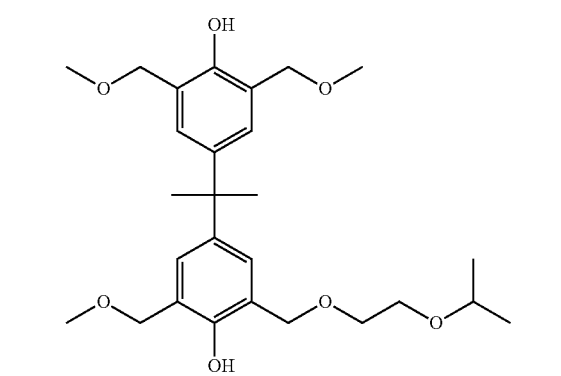
Examples of the compounds represented by formulas (G-3) and (G-4) include those illustrated below.
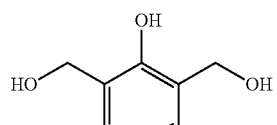
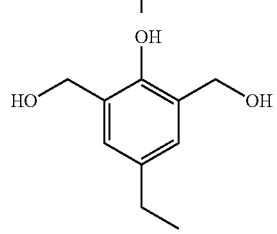
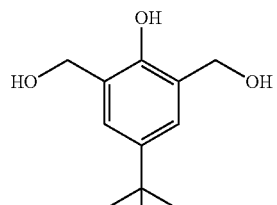
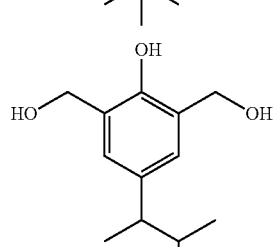
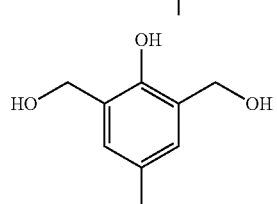
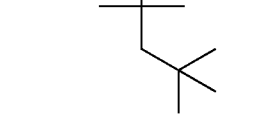
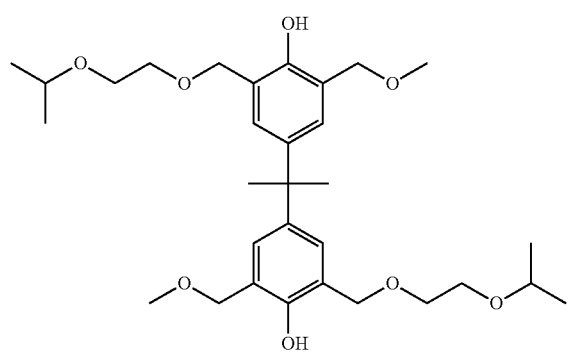
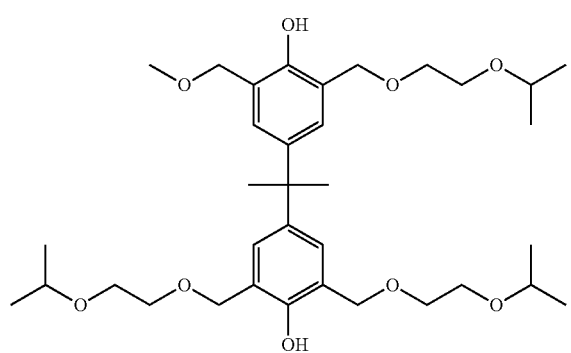

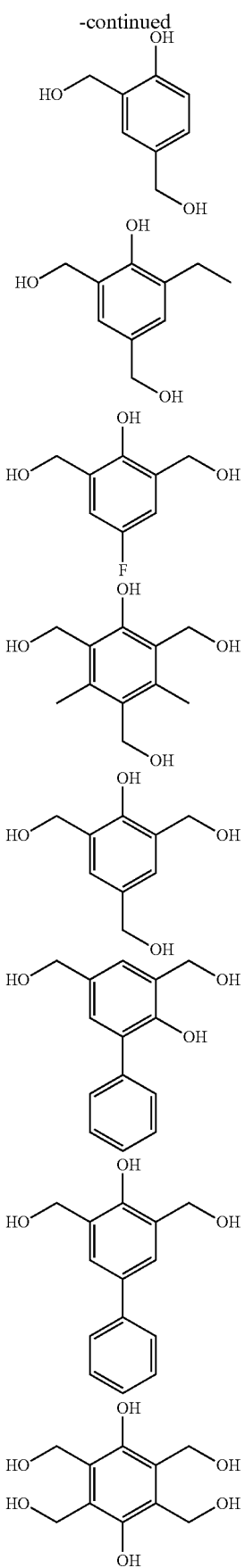
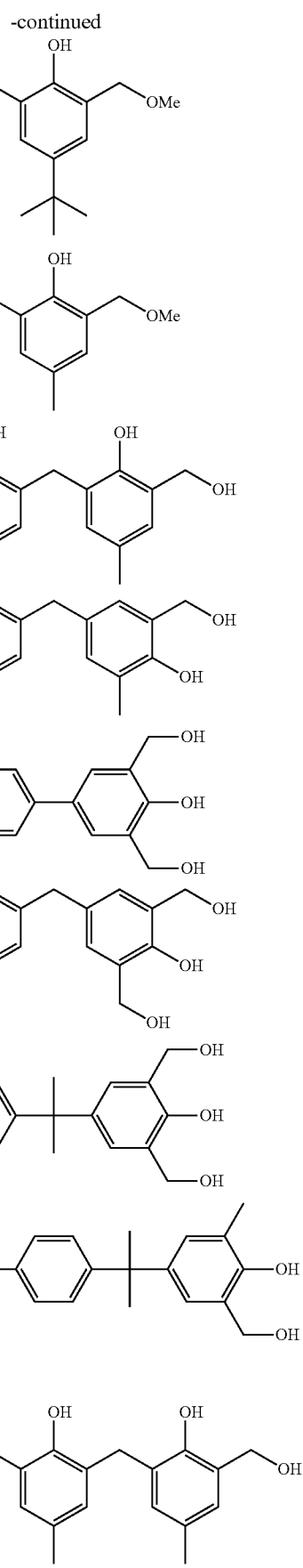

-continued

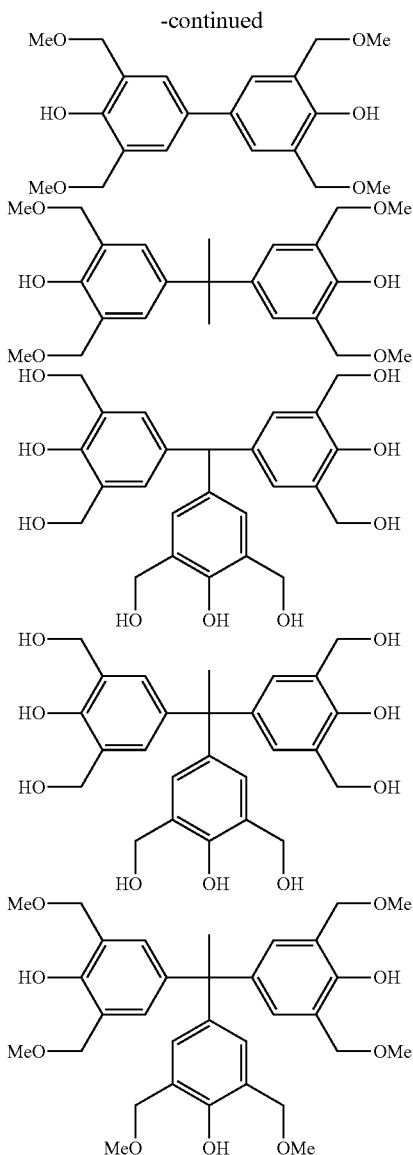

In the formulas, Me denotes a methyl group.

The entire contents of the disclosure of WO 2014/208542 are incorporated herein by reference.

When the crosslinking agent is used, the content of the crosslinking agent is, for example, within the range of 1% by mass to 50% by mass, and preferably 5% by mass to 30% by mass, relative to the reaction product.

Additional Components

To eliminate the occurrence of defects, such as pinholes or striation, and to further enhance the applicability to surface unevenness, the resist underlayer film-forming composition of the present invention may further include a surfactant. Examples of the surfactants include nonionic surfactants, such as polyoxyethylene alkyl ethers including polyoxyethylene lauryl ether, polyoxyethylene stearyl ether, polyoxyethylene cetyl ether, and polyoxyethylene oleyl ether, polyoxyethylene alkylallyl ethers including polyoxyethylene octylphenol ether and polyoxyethylene nonylphenol ether, polyoxyethylene/polyoxypropylene block copolymers, sorbitan fatty acid esters including sorbitan monolaurate, sorbitan monopalmitate, sorbitan monostearate, sorbitan monooleate, sorbitan trioleate, and sorbitan tristearate, and polyoxyethylene sorbitan fatty acid esters including polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate; fluorosurfactants, such as EFTOP series EF301, EF303, and EF352 (product names, manufactured by Tohkem Products Corp.), MEGAFACE series F171, F173, and R-30 (product names, manufactured by DIC CORPORATION), Fluorad series FC430 and FC431 (product names, manufactured by Sumitomo 3M Limited), AsahiGuard AG710, and Surflon series S-382, SC101, SC102, SC103, SC104, SC105, and SC106 (product names, manufactured by AGC Inc.); and organosiloxane polymer KP341 (manufactured by Shin-Etsu Chemical Co., Ltd.). The amount of the surfactant is usually 2.0% by mass or less, and preferably 1.0% by mass or less of the total solid content of the resist underlayer film-forming composition of the present invention. The surfactants may be used each alone or in combination of two or more thereof.

The resist underlayer film-forming composition of the present invention is preferably an electron beam resist underlayer film-forming composition or an EUV resist underlayer film-forming composition used in an electron beam (EB) lithography step and an EUV exposure step, and is preferably an EUV resist underlayer film-forming composition.

<Resist Underlayer Films>

A resist underlayer film of the present invention may be produced by applying the resist underlayer film-forming composition described hereinabove onto a semiconductor substrate and baking the composition.

The resist underlayer film of the present invention is preferably an electron beam resist underlayer film or an EUV resist underlayer film.

Examples of the semiconductor substrates to which the resist underlayer film-forming composition of the present invention is applied include silicon wafers, germanium wafers, and compound semiconductor wafers, such as gallium arsenide, indium phosphide, gallium nitride, indium nitride, and aluminum nitride.

The semiconductor substrate that is used may have an inorganic film on its surface. For example, such an inorganic film is formed by ALD (atomic layer deposition), CVD (chemical vapor deposition), reactive sputtering, ion plating, vacuum deposition, or spin coating (spin on glass: SOG). Examples of the inorganic films include polysilicon films, silicon oxide films, silicon nitride films, BPSG (boro-phospho silicate glass) films, titanium nitride films, titanium oxynitride films, tungsten films, gallium nitride films, and gallium arsenide films.

The resist underlayer film-forming composition of the present invention is applied onto such a semiconductor substrate with an appropriate applicator, such as a spinner or a coater. Subsequently, the composition is baked with a heating device, such as a hot plate, to form a resist underlayer film. The baking conditions are appropriately selected from baking temperatures of 100° C. to 400° C. and amounts of baking time of 0.3 minutes to 60 minutes. Preferably, the baking temperature is 120° C. to 350° C. and the baking time is 0.5 minutes to 30 minutes. More preferably, the baking temperature is 150° C. to 300° C. and the baking time is 0.8 minutes to 10 minutes.

The film thickness of the resist underlayer film that is formed is, for example, within the range of 0.001 μm (1 nm) to 10 μm, 0.002 μm (2 nm) to 1 μm, 0.003 μm (3 nm) to 0.5

μm (500 nm), 0.001 μm (1 nm) to 0.05 μm (50 nm), 0.002 μm (2 nm) to 0.05 μm (50 nm), 0.003 μm (3 nm) to 0.05 μm (50 nm), 0.004 μm (4 nm) to 0.05 μm (50 nm), 0.005 μm (5 nm) to 0.05 μm (50 nm), 0.003 μm (3 nm) to 0.03 μm (30 nm), 0.003 μm (3 nm) to 0.02 μm (20 nm), 0.005 μm (5 nm) to 0.02 μm (20 nm), 0.002 μm (2 nm) to 0.01 μm (10 nm), 0.003 μm (3 nm) to 0.01 μm (10 nm), 0.002 μm (2 nm) to 0.006 μm (6 nm), 0.004 μm (4 nm), or 0.005 μm (5 nm). If the baking temperature is lower than the range mentioned above, crosslinking is insufficient. If, on the other hand, the baking temperature is higher than the above range, the resist underlayer film may be decomposed by heat.

<Methods for Producing Patterned Substrates, and Methods for Manufacturing Semiconductor Devices>

A patterned substrate is produced through the following steps. Usually, a patterned substrate is produced by forming a photoresist layer on the resist underlayer film. The photoresist that is formed on the resist underlayer film by application and baking according to a method known per se is not particularly limited as long as the resist is sensitive to the light used for exposure. Any of negative photoresists and positive photoresists may be used, such as positive photoresists composed of a novolak resin and 1,2-naphthoquinonediazide sulfonic acid ester; chemically amplified photoresists composed of a photoacid generator and a binder having a group that is decomposed by an acid to increase the alkali dissolution rate; chemically amplified photoresists composed of an alkali-soluble binder, a photoacid generator, and a low-molecular compound that is decomposed by an acid to increase the alkali dissolution rate of the photoresist; chemically amplified photoresists composed of a photoacid generator, a binder having a group that is decomposed by an acid to increase the alkali dissolution rate, and a low-molecular compound that is decomposed by an acid to increase the alkali dissolution rate of the photoresist; and resists containing metal elements. Examples include V146G, product name, manufactured by JSR CORPORATION, APEX-E, product name, manufactured by Shipley, PAR710, product name, manufactured by Sumitomo Chemical Co., Ltd., and AR2772 and SEPR430, product names, manufactured by Shin-Etsu Chemical Co., Ltd. Examples further include fluorine-containing polymer photoresists, such as those according to Proc. SPIE, Vol. 3999, 330-334 (2000), Proc. SPIE, Vol. 3999, 357-364 (2000), and Proc. SPIE, Vol. 3999, 365-374 (2000). Metal-containing resists (metal resists) that contain metals may also be used.

Specifically, for example, use may be made of, but not limited to, the so-called resist compositions and metal-containing resist compositions, such as resist compositions, radiation-sensitive resin compositions, and high-resolution patterning compositions based on organic metal solutions according to, for example, WO 2019/188595, WO 2019/187881, WO 2019/187803, WO 2019/167737, WO 2019/167725, WO 2019/187445, WO 2019/167419, WO 2019/123842, WO 2019/054282, WO 2019/058945, WO 2019/058890, WO 2019/039290, WO 2019/044259, WO 2019/044231, WO 2019/026549, WO 2018/193954, WO 2019/172054, WO 2019/021975, WO 2018/230334, WO 2018/194123, JP 2018-180525 A, WO 2018/190088, JP 2018-070596 A, JP 2018-028090 A, JP 2016-153409 A, JP 2016-130240 A, JP 2016-108325 A, JP 2016-047920 A, JP 2016-035570 A, JP 2016-035567 A, JP 2016-035565 A, JP 2019-101417 A, JP 2019-117373 A, JP 2019-052294 A, JP 2019-008280 A, JP 2019-008279 A, JP 2019-003176 A, JP 2019-003175 A, JP 2018-197853 A, JP 2019-191298 A, JP 2019-061217 A, JP 2018-045152 A, JP 2018-022039 A, JP 2016-090441 A, JP 2015-10878 A, JP 2012-168279 A, JP 2012-022261 A, JP 2012-022258 A, JP 2011-043749 A, JP 2010-181857 A, JP 2010-128369 A, WO 2018/031896, JP 2019-113855 A, WO 2017/156388, WO 2017/066319, JP 2018-41099 A, WO 2016/065120, WO 2015/026482, JP 2016-29498 A, and JP 2011-253185 A.

Examples of the resist compositions include the following.

(i) Active ray-sensitive or radiation-sensitive resin compositions that include a resin A which has a repeating unit containing an acid-decomposable group in which a polar group is protected by a protective group capable of being detached by the action of an acid, and a compound represented by the general formula (11).

[Chem. 38]

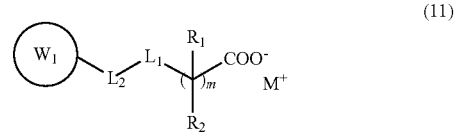

(11)

In the general formula (11), m denotes an integer of 1 to 6.

$R_1$ and $R_2$ each independently denote a fluorine atom or a perfluoroalkyl group.

$L_1$ denotes —O—, —S—, —COO—, —SO$_2$—, or —SO$_3$—.

$L_2$ denotes an optionally substituted alkylene group or a single bond.

$W_1$ denotes an optionally substituted cyclic organic group.

$M^+$ denotes a cation.

(ii) Metal-containing film-forming compositions for extreme ultraviolet or electron beam lithography that include a compound having a metal-oxygen covalent bond, and a solvent. Here, the metal element constituting the compound belongs to Period 3 to Period 7 of Group 3 to Group 15 of the periodic table.

(iii) Radiation-sensitive resin compositions that include an acid generator, and a polymer which has a first structural unit represented by formula (21) below and a second structural unit of formula (22) below containing an acid-dissociative group.

[Chem. 39]

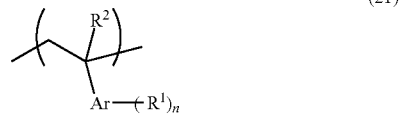

(21)

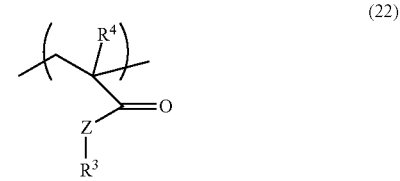

(22)

(In formula (21), Ar is a residue of a C6-C20 arene after removal of (n+1) hydrogen atoms. $R^1$ is a hydroxy group, a sulfanyl group, or a C1-C20 monovalent organic group. The letter n is an integer of 0 to 11. When n is 2 or greater, the groups $R^1$ are the same as or different from one another. $R^2$ is a hydrogen atom, a fluorine atom, a methyl group, or a trifluoromethyl group.

In formula (22), $R^3$ is a C1-C20 monovalent group including the acid-dissociative group. Z is a single bond, an oxygen atom, or a sulfur atom. $R^4$ is a hydrogen atom, a fluorine atom, a methyl group, or a trifluoromethyl group.)

(iv) Resist compositions that include an acid generator, and a resin (A1) which contains a structural unit having a cyclic carbonate ester structure, a structural unit represented by formula (II), and a structural unit having an acid-labile group.

[Chem. 40]

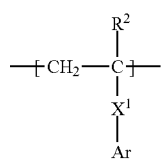

(II)

[In formula (II),
$R^2$ denotes an optionally halogenated C1-C6 alkyl group, a hydrogen atom, or a halogen atom, X' denotes a single bond, —CO—O—*, or —CO—NR$^4$—*, * indicates a bond to —Ar, $R^4$ denotes a hydrogen atom or a C1-C4 alkyl group, and Ar denotes a C6-C20 aromatic hydrocarbon group optionally having one or more groups selected from the group consisting of hydroxy groups and carboxyl groups.]

(v) Resist compositions that generate an acid upon exposure and change their solubility in a developer by the action of the acid.

The resist compositions include a substrate component (A) that changes the solubility in a developer by the action of an acid, and a fluorine additive component (F) that exhibits decomposability in an alkaline developer.

The fluorine additive component (F) comprises a fluororesin component (F1) that contains a constituent unit (f1) containing a base-dissociative group, and a constituent unit (f2) containing a group represented by the general formula (f2-r-1) below.

[Chem. 41]

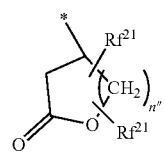

(f2-r-1)

[In formula (f2-r-1), Rf$^{21}$ independently at each occurrence is a hydrogen atom, an alkyl group, an alkoxy group, a hydroxy group, a hydroxyalkyl group, or a cyano group. The letter n" is an integer of 0 to 2. * is a bond.]

(vi) The resist compositions described above in (v) in which the constituent unit (f1) comprises a constituent unit represented by the general formula (f1-1) below or a constituent unit represented by the general formula (f1-2) below.

[Chem. 42]

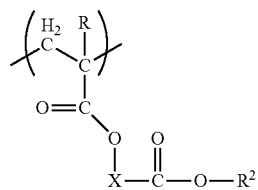

(f1-1)

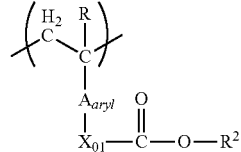

(f1-2)

[In formulas (f1-1) and (f1-2), R independently at each occurrence is a hydrogen atom, a C1-C5 alkyl group, or a C1-C5 alkyl halide group. X is a divalent linking group having no acid-dissociative sites. $A_{aryl}$ is an optionally substituted, divalent aromatic cyclic group. $X_{01}$ is a single bond or a divalent linking group. $R^2$ independently at each occurrence is an organic group having a fluorine atom.]

Examples of the metal-containing resist compositions include coatings that contain a metal oxo-hydroxo network which has an organic ligand through a metal-carbon bond and/or a metal-carboxylate bond.

(vii) Inorganic oxo/hydroxo-based compositions.

Examples of the resist films include the following.

(i) Resist films that include a base resin which contains a repeating unit represented by formula (a1) below and/or a repeating unit represented by formula (a2) below, and a repeating unit which generates, upon exposure, an acid bonded to the polymer main chain.

[Chem. 43]

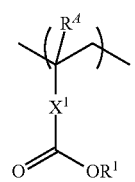

(a1)

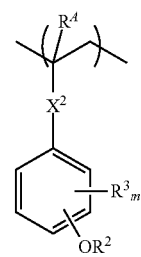

(a2)

(In formulas (a1) and (a2), $R^A$ independently at each occurrence is a hydrogen atom or a methyl group. $R^1$ and $R^2$ are each independently a C4-C6 tertiary alkyl group. $R^3$ independently at each occurrence is a fluorine atom or a methyl group. The letter m is an integer of 0 to 4. $X^1$ is a single bond, a phenylene group, or a naphthylene group, or is a C1-C12 linking group including at least one selected from ester bonds, lactone rings, phenylene groups, and naphthylene groups. $X^2$ is a single bond, an ester bond, or an amide bond.)

Examples of the resist materials include the following.
(i) Resist materials that include a polymer which has a repeating unit represented by formula (a1) or (a2) below.

[Chem. 44]

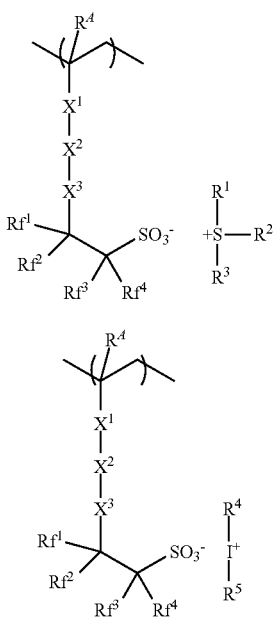

(In formulas (a1) and (a2), $R^A$ is a hydrogen atom or a methyl group. $X^1$ is a single bond or an ester group. $X^2$ is a linear, branched, or cyclic C1-C12 alkylene group or a C6-C10 arylene group in which the alkylene group may be substituted with an ether group, an ester group, or a lactone ring-containing group in place of part of the methylene groups. $X^2$ is substituted with a bromine atom in place of at least one hydrogen atom. $X^3$ is a single bond, an ether group, an ester group, or a C1-C12 linear, branched, or cyclic alkylene group optionally substituted with an ether group or an ester group in place of part of the methylene groups constituting the alkylene group. $Rf^1$ to $Rf^4$ are each independently a hydrogen atom, a fluorine atom, or a trifluoromethyl group, and at least one is a fluorine atom or a trifluoromethyl group. Furthermore, $Rf^1$ and $Rf^2$ may be combined to form a carbonyl group. $R^1$ to $R^5$ are each independently a linear, branched, or cyclic C1-C12 alkyl group, a linear, branched, or cyclic C2-C12 alkenyl group, a C2-C12 alkynyl group, a C6-C20 aryl group, a C7-C12 aralkyl group, or a C7-C12 aryloxyalkyl group, and each of these groups may be substituted with a hydroxy group, a carboxyl group, a halogen atom, an oxo group, a cyano group, an amide group, a nitro group, a sultone group, a sulfone group, or a sulfonium salt-containing group in place of part or all of the hydrogen atoms, and may be substituted with an ether group, an ester group, a carbonyl group, a carbonate group, or a sulfonic acid ester group in place of part of the methylene groups. Furthermore, $R^1$ and $R^2$ may be bonded to each other to form a ring together with the sulfur atom to which they are bonded.)

(ii) Resist materials that include a base resin which includes a polymer containing a repeating unit represented by formula (a) below.

[Chem. 45]

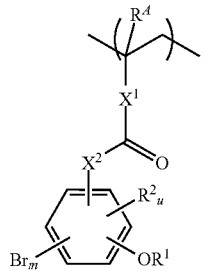

(In formula (a), $R^A$ is a hydrogen atom or a methyl group. $R^1$ is a hydrogen atom or an acid-labile group. $R^2$ is a linear, branched, or cyclic C1-C6 alkyl group or a halogen atom other than bromine. $X^1$ is a single bond or a phenylene group, or is a linear, branched, or cyclic C1-C12 alkylene group optionally containing an ester group or a lactone ring. $X^2$ is —O—, —O—$CH_2$—, or —NH—. The letter m is an integer of 1 to 4. The letter n is an integer of 0 to 3.)

Examples of the coating solutions include the following.
(i) Coating solutions that include an organic solvent; a first organic metal composition which is represented by the formula $R_zSnO_{(2-(z/2)-(x/2))}(OH)_x$ (where $0<z\le2$ and $0<(z+x)\le4$) or the formula $R'_nSnX_{4-n}$ (where n=1 or 2) or is a mixture thereof wherein R and R' are independently a C1-C31 hydrocarbyl group, and X is a ligand having a hydrolyzable bond to Sn or is a combination of such ligands; and a hydrolyzable metal compound represented by the formula $MX'_v$ (where M is a metal selected from Group 2 to Group 16 of the periodic table of the elements, v=a number of 2 to 6, and X' is a ligand having a hydrolyzable M-X bond or is a combination of such ligands).
(ii) Coating solutions that include an organic solvent and a first organic metal compound represented by the formula $RSnO_{(3/2-x/2)}(OH)_x$ (where $0<x<3$) wherein the solution contains about 0.0025 M to about 1.5 M of tin, R is a C3-C31 alkyl or cycloalkyl group, and the alkyl or cycloalkyl group is bonded to tin through its secondary or tertiary carbon atom.
(iii) Inorganic pattern-forming precursor aqueous solutions that include a mixture of water, a metal suboxide cation, a polyatomic inorganic anion, and a radiation-sensitive ligand containing a peroxide group.

Exposure is performed using, for example, i-ray, KrF excimer laser beam, ArF excimer laser beam, EUV (extreme ultraviolet ray), or EB (electron beam) through a mask (a reticle) designed to form a predetermined pattern. EUV (extreme ultraviolet ray) is preferably used for the exposure of the resist underlayer film-forming composition of the present invention. An alkaline developer is used for the development, and the conditions are appropriately selected from development temperatures of 5° C. to 50° C. and amounts of development time of 10 seconds to 300 seconds. Examples of the alkaline developers that may be used include aqueous solutions of alkalis, such as inorganic alkalis including sodium hydroxide, potassium hydroxide, sodium carbonate, sodium silicate, sodium metasilicate, and aqueous ammonia, primary amines including ethylamine and n-propylamine, secondary amines including diethylamine and di-n-butylamine, tertiary amines including triethylamine and methyldiethylamine, alcohol amines including dimethylethanolamine and triethanolamine, quaternary ammonium salts including tetramethylammonium hydroxide, tetraethylammonium hydroxide, and choline, and cyclic amines including pyrrole and piperidine. Appropriate amounts of alcohols, such as isopropyl alcohol, and surfactants, such as nonionic surfactants, may be added to the aqueous alkali solutions described above. Of the developers mentioned above, quaternary ammonium salts are preferable, and tetramethylammonium hydroxide and choline are more preferable. Additional components, such as surfactants, may be added to these developers. An organic solvent, such as butyl acetate, may be used in place of the alkali developer to develop portions of the photoresist that remain low in alkali dissolution rate. A substrate having a pattern of the resist may be produced through the steps described above.

Next, the resist underlayer film is dry-etched using as a mask the resist pattern formed. When the inorganic film described hereinabove is present on the surface of the semiconductor substrate that is used, the surface of the inorganic film is exposed. When there is no inorganic film on the surface of the semiconductor substrate that is used, the surface of the semiconductor substrate is exposed. The substrate is then processed by a method known per se (such as a dry etching method). A semiconductor device may be thus manufactured.

EXAMPLES

The weight average molecular weight of polymers according to Synthesis Example 1 to Synthesis Example 3, and Comparative Synthesis Example 1 to Comparative Synthesis Example 3 in the present description is the results measured by gel permeation chromatography (hereinafter, abbreviated as GPC). The measurement was performed using a GPC device manufactured by TOSOH CORPORATION under the following measurement conditions.
  GPC columns: Shodex KF803L, Shodex KF802, and Shodex KF801 [registered trademark] (SHOWA DENKO K.K.)
  Column temperature: 40° C.
  Solvent: N,N-dimethylformamide (DMF)
  Flow rate: 0.6 ml/min
  Standard samples: Polystyrenes (manufactured by TOSOH CORPORATION)

Synthesis Example 1

3.00 g of monoallyl diglycidyl isocyanuric acid (manufactured by SHIKOKU CHEMICALS CORPORATION), 3.27 g of 3,3',4,4'-diphenylsulfonetetracarboxylic dianhydride (manufactured by Tokyo Chemical Industry Co., Ltd.), 0.64 g of 4-(methylsulfonyl)benzoic acid (manufactured by Tokyo Chemical Industry Co., Ltd.), and 0.27 g of tetrabutylphosphonium bromide (manufactured by HOKKO CHEMICAL INDUSTRY CO., LTD.) were added and dissolved into 21.83 g of propylene glycol monomethyl ether. The reaction vessel was purged with nitrogen and the reaction was performed at 105° C. for 24 hours to yield a polymer solution. The polymer solution was free from clouding and other changes, even after being cooled to room temperature, showing a good solubility in propylene glycol monomethyl ether. GPC analysis showed that the polymer in the solution obtained had a weight average molecular weight of 8,300 relative to standard polystyrenes. The polymer obtained in this synthesis example has structural units represented by the following formulas (XX), (XY), and (XZ).

[Chem. 46]

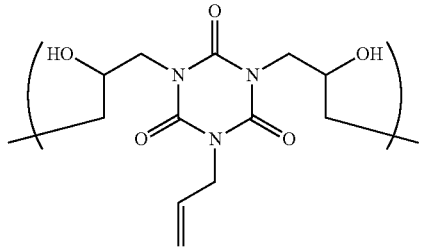

(XX)

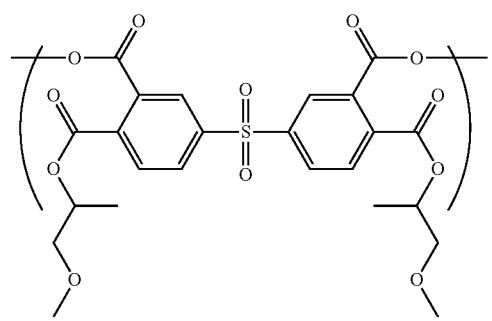

(XY)

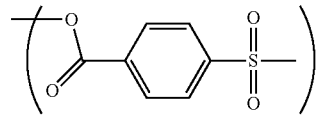

(XZ)

Synthesis Example 2

3.00 g of monoallyl diglycidyl isocyanuric acid (manufactured by SHIKOKU CHEMICALS CORPORATION), 3.27 g of 3,3',4,4'-diphenylsulfonetetracarboxylic dianhydride (manufactured by Tokyo Chemical Industry Co., Ltd.), 0.53 g of 5-norbornene-2,3-dicarboxylic anhydride (manufactured by Tokyo Chemical Industry Co., Ltd.), and 0.27 g of tetrabutylphosphonium bromide (manufactured by HOKKO CHEMICAL INDUSTRY CO., LTD.) were added and dissolved into 21.49 g of propylene glycol monomethyl ether. The reaction vessel was purged with nitrogen and the reaction was performed at 105° C. for 24 hours to yield a polymer solution. The polymer solution was free from clouding and other changes, even after being cooled to room temperature, showing a good solubility in propylene glycol monomethyl ether. GPC analysis showed that the polymer in the solution obtained had a weight average molecular weight of 12,300 relative to standard polystyrenes. The polymer obtained in this synthesis example has structural units represented by the following formulas (XX), (XY), and (Xa).

[Chem. 47]

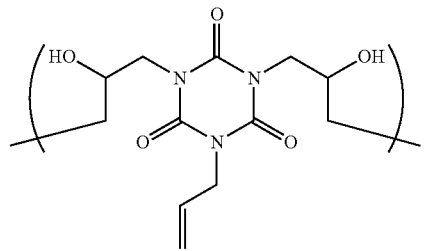
(XX)

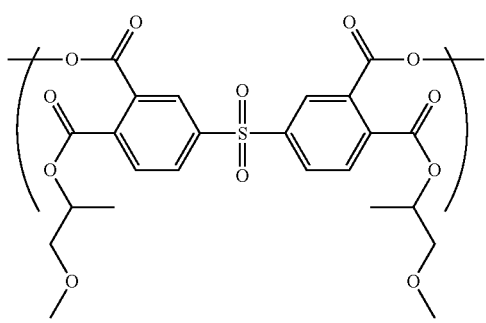
(XY)

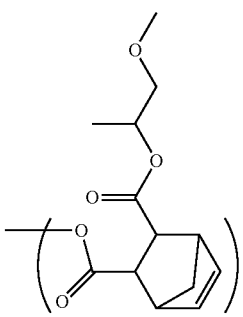
(Xa)

Synthesis Example 3

3.00 g of monoallyl diglycidyl isocyanuric acid (manufactured by SHIKOKU CHEMICALS CORPORATION), 3.27 g of 3,3',4,4'-diphenylsulfonetetracarboxylic dianhydride (manufactured by Tokyo Chemical Industry Co., Ltd.), and 0.27 g of tetrabutylphosphonium bromide (manufactured by HOKKO CHEMICAL INDUSTRY CO., LTD.) were added and dissolved into 19.90 g of propylene glycol monomethyl ether. The reaction vessel was purged with nitrogen and the reaction was performed at 105° C. for 24 hours to yield a polymer solution. The polymer solution was free from clouding and other changes, even after being cooled to room temperature, showing a good solubility in propylene glycol monomethyl ether. GPC analysis showed that the polymer in the solution obtained had a weight average molecular weight of 7,900 relative to standard polystyrenes. The polymer obtained in this synthesis example has structural units represented by the following formulas (XX) and (XY).

[Chem. 48]

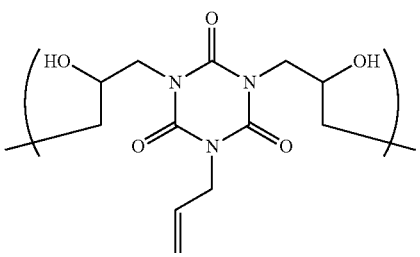
(XX)

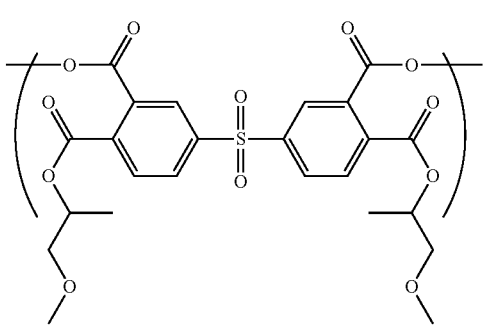
(XY)

Comparative Synthesis Example 1

3.00 g of monoallyl diglycidyl isocyanuric acid (manufactured by SHIKOKU CHEMICALS CORPORATION), 1.91 g of 3,3'-dithiodipropionic acid (product name: DTDPA, manufactured by SAKAI CHEMICAL INDUSTRY CO., LTD.), 0.57 g of adamantanecarboxylic acid (manufactured by Tokyo Chemical Industry Co., Ltd.), and 0.14 g of tetrabutylphosphonium bromide (manufactured by HOKKO CHEMICAL INDUSTRY CO., LTD.) were added and dissolved into 6.87 g of propylene glycol monomethyl ether. The reaction vessel was purged with nitrogen and the reaction was performed at 105° C. for 8 hours to yield a polymer solution. The polymer solution was free from clouding and other changes, even after being cooled to room temperature, showing a good solubility in propylene glycol monomethyl ether. GPC analysis showed that the polymer in the solution obtained had a weight average molecular weight of 5,000 relative to standard polystyrenes. The polymer obtained in this synthesis example has structural units represented by the following formulas (XX), (Xb), and (Xc).

[Chem. 49]

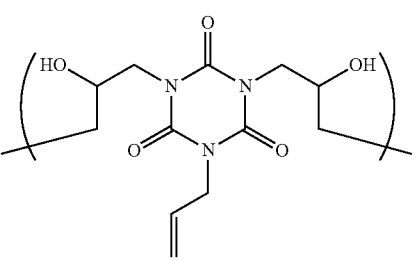
(XX)

(Xb)

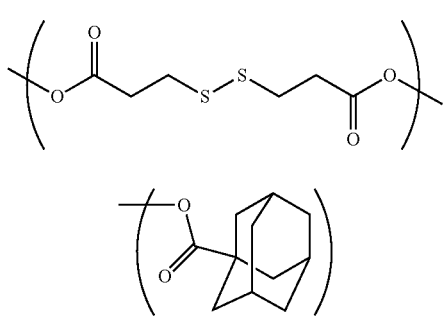

(Xc)

(Xa)

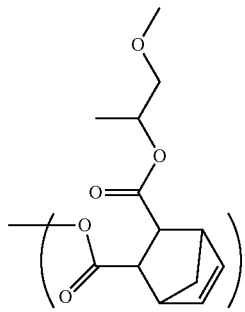

Comparative Synthesis Example 2

2.50 g of monoallyl diglycidyl isocyanuric acid (manufactured by SHIKOKU CHEMICALS CORPORATION), 1.47 g of diethylbarbituric acid (manufactured by Tokyo Chemical Industry Co., Ltd.), 0.29 g of 5-norbornene-2,3-dicarboxylic anhydride (manufactured by Tokyo Chemical Industry Co., Ltd.), and 0.16 g of ethyltriphenylphosphonium bromide (manufactured by Tokyo Chemical Industry Co., Ltd.) were added and dissolved into 8.97 g of propylene glycol monomethyl ether. The reaction vessel was purged with nitrogen and the reaction was performed at 110° C. for 24 hours to yield a polymer solution. The polymer solution was free from clouding and other changes, even after being cooled to room temperature, showing a good solubility in propylene glycol monomethyl ether. GPC analysis showed that the polymer in the solution obtained had a weight average molecular weight of 3,000 relative to standard polystyrenes. The polymer obtained in this synthesis example has structural units represented by the following formulas (XX), (Xd), and (Xa).

[Chem. 50]

(XX)

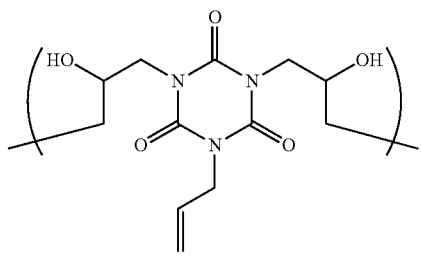

(Xd)

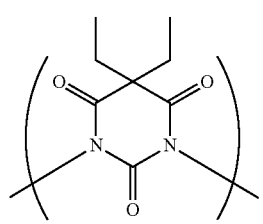

Examples 1 to 3 and Comparative Examples 1 and 2

The polymers from Synthesis Examples 1 to 3 and Comparative Synthesis Examples 1 and 2, crosslinking agents, a curing catalyst, and solvents were mixed in proportions according to Tables 1 and 2. The mixtures were filtered through a 0.1 μm fluororesin filter. Resist underlayer film-forming compositions were thus prepared in the form of a solution.

In Tables 1 and 2, tetramethoxymethyl glycoluril (manufactured by Cytec Industries Japan) is abbreviated as PL-LI, imidazo[4,5-d]imidazole-2,5(1H,3H)-dione, tetrahydro-1,3,4,6-tetrakis[(2-methoxy-1-methylethoxy)methyl]- as PGME-PL, pyridinium-p-hydroxybenzenesulfonic acid as PyPSA, propylene glycol monomethyl ether acetate as PGMEA, and propylene glycol monomethyl ether as PGME. The amounts are shown in parts by mass.

TABLE 1

| | Polymer | Crosslinking agent | Curing catalyst | Solvents | |
|---|---|---|---|---|---|
| Example 1 | Synthesis Example 1 | PGME-PL | PγPSA | PGME | PGMEA |
| (Parts by mass) | 0.15 | 0.03 | 0.01 | 90 | 10 |
| Example 2 | Synthesis Example 2 | PGME-PL | PγPSA | PGME | PGMEA |
| (Parts by mass) | 0.15 | 0.03 | 0.01 | 90 | 10 |
| Example 3 | Synthesis Example 3 | PGME-PL | PγPSA | PGME | PGMEA |
| (Parts by mass) | 0.15 | 0.03 | 0.01 | 90 | 10 |

TABLE 2

| | Polymer | Crosslinking agent | Curing catalyst | Solvents | |
|---|---|---|---|---|---|
| Comparative Example 1 | Comparative Synthesis Example 1 | PL-LI | PγPSA | PGME | PGMEA |
| (Parts by mass) | 0.15 | 0.03 | 0.01 | 70 | 30 |
| Comparative Example 2 | Comparative Synthesis Example 2 | PL-LI | PγPSA | PGME | PGMEA |
| (Parts by mass) | 0.15 | 0.03 | 0.01 | 90 | 10 |

[Test of Dissolution into Photoresist Solvents]

Each of the resist underlayer film-forming compositions of Example 1, Example 2, Example 3, Comparative Example 1, and Comparative Example 2 was applied onto a silicon wafer as a semiconductor substrate using a spinner. The silicon wafer was set on a hot plate and the coating was baked at 205° C. for 1 minute to form a resist underlayer film (film thickness: 4 nm). These resist underlayer films were soaked in photoresist solvents, specifically, ethyl lactate and propylene glycol monomethyl ether. The resist underlayer films were confirmed insoluble in these solvents.

[Formation of Positive Resist Pattern with EUV Exposure Device]

Each of the resist underlayer film-forming compositions of Example 1, Example 2, Example 3, Comparative Example 1, and Comparative Example 2 was applied onto a silicon wafer using a spinner. The silicon wafer was baked on a hot plate at 205° C. for 60 seconds to form resist underlayer films having a film thickness of 4 nm. The resist underlayer film was spin-coated with an EUV positive resist solution (containing a methacrylic polymer), and the coating was heated at 130° C. for 60 seconds to form an EUV resist film. The resist film was exposed under the predetermined conditions using an EUV exposure lithography device (NXE-3400). After the exposure, baking (PEB) was performed at 100° C. for 60 seconds. The resist film was then cooled to room temperature on a cooling plate and was developed with an alkaline developer (2.38% TMAH), and subsequently a resist pattern having 19 nm line pattern/32 nm pitches was formed. The length measurement for the resist pattern was made with a scanning electron microscope (CG4100 manufactured by Hitachi High-Tech Corporation). The resist patterns formed above were evaluated as "good" when a line pattern with a CD size of 19 nm had been formed, and were rated as "defective" when a bridge was found in the line pattern. Table 3 shows the results.

[Table 3]

TABLE 3

| | CD size 19 nm line pattern |
|---|---|
| Example 1 | Good |
| Example 2 | Good |
| Example 3 | Good |
| Comparative Example 1 | Defective |
| Comparative Example 2 | Defective |

As compared with Comparative Example 1 and Comparative Example 2, Example 1, Example 2, and Example 3 successfully suppressed bridge defects in the line patterns and attained a good patternability.

INDUSTRIAL APPLICABILITY

The resist underlayer film-forming composition according to the present invention is a composition for forming a resist underlayer film that allows a desired resist pattern to be formed. The resist underlayer film-forming composition is useful in a method for producing a resist-patterned substrate, and a method for manufacturing a semiconductor device.

The invention claimed is:

1. A resist underlayer film-forming composition comprising a polymer and a solvent, the polymer having a unit structure represented by the following formula (I):

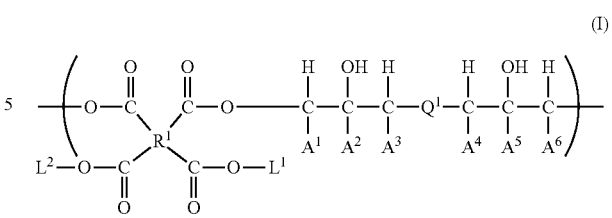

wherein, in formula (I), $A^1$, $A^2$, $A^3$, $A^4$, $A^5$, and $A^6$ each independently denote a hydrogen atom, a methyl group, or an ethyl group; $Q^1$ denotes a divalent organic group; $R^1$ denotes a tetravalent organic group comprising a C6-C40 aromatic ring structure; and $L^1$ and $L^2$ each independently denote a hydrogen atom or a C1-C10 alkyl group optionally substituted with a hydroxy group and optionally interrupted by an oxygen atom.

2. The resist underlayer film-forming composition according to claim 1, wherein $R^1$ comprises a biphenylene structure.

3. The resist underlayer film-forming composition according to claim 1, wherein the polymer comprises a repeating unit represented by the following formula (a-2):

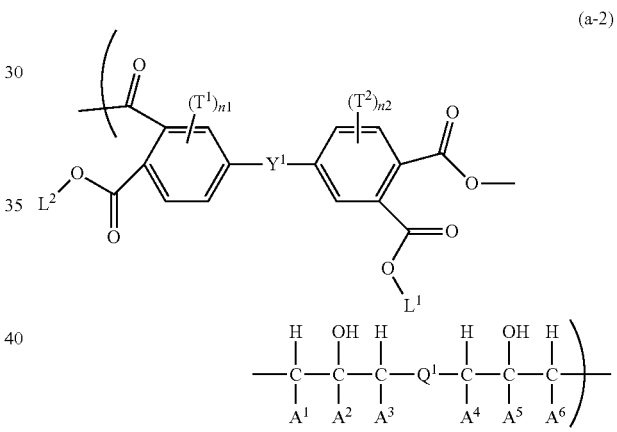

wherein, in formula (a-2), $Y^1$ denotes a single bond, an oxygen atom, a sulfur atom, a C1-C10 alkylene group optionally substituted with a halogen atom or a C6-C40 aryl group, or a sulfonyl group; n1 quantity of $T^1$ and n2 quantity of $T^2$ each independently denote a hydrogen atom or a C1-C10 alkyl group, and are optionally bonded to each other to bridge the two benzene rings; n1 and n2 each independently denote an integer of 0 to 4; and $Q^1$, $A^1$, $A^2$, $A^3$, $A^4$, $A^5$, $A^6$, $L^1$, and $L^2$ are the same as defined in claim 1.

4. The resist underlayer film-forming composition according to claim 1, wherein the polymer further has a heterocyclic structure.

5. The resist underlayer film-forming composition according to claim 3, wherein $Y^1$ is a sulfonyl group.

6. The resist underlayer film-forming composition according to claim 1, wherein an end of the polymer is capped with a compound.

7. The resist underlayer film-forming composition according to claim 6, wherein the compound comprises an optionally substituted aliphatic ring.

8. The resist underlayer film-forming composition according to claim 6, wherein the compound is represented by formula (1) and formula (2) below:

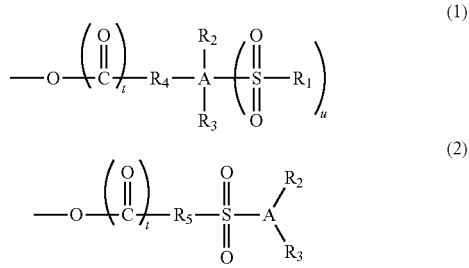

wherein, in formulas (1) and (2), $R^1$ denotes a C1-C6 alkyl group, a phenyl group, a pyridyl group, a halogeno group, or a hydroxy group, and optionally has a substituent; $R^2$ denotes a hydrogen atom, a C1-C6 alkyl group, a hydroxy group, a halogeno group, or an ester group represented by —C(=O)O—X where X denotes an optionally substituted C1-C6 alkyl group; $R^3$ denotes a hydrogen atom, a C1-C6 alkyl group, a hydroxy group, or a halogeno group; $R^4$ denotes a direct bond or a C1-C8 divalent organic group; $R^5$ denotes a C1-C8 divalent organic group; A denotes an aromatic ring or an aromatic heterocyclic ring; t denotes 0 or 1; and u denotes 1 or 2.

9. The resist underlayer film-forming composition according to claim 1, further comprising a curing catalyst.

10. The resist underlayer film-forming composition according to claim 1, further comprising a crosslinking agent.

11. A resist underlayer film, which is a baked product of a coating film of the resist underlayer film-forming composition according to claim 1.

12. A method for producing a patterned substrate, comprising the steps of:
applying the resist underlayer film-forming composition according to claim 1 onto a semiconductor substrate and baking the applied composition to form a resist underlayer film;
applying a resist onto the resist underlayer film and baking the applied resist to form a resist film;
exposing the semiconductor substrate coated with the resist underlayer film and the resist; and
developing the exposed resist film, and performing patterning.

13. A method for manufacturing a semiconductor device, comprising the steps of:
forming on a semiconductor substrate a resist underlayer film of the resist underlayer film-forming composition according to claim 1;
forming a resist film on the resist underlayer film;
forming a resist pattern by applying a light or electron beam to the resist film followed by development;
forming a pattern in the resist underlayer film by etching the resist underlayer film through the resist pattern formed; and
processing the semiconductor substrate through the pattern in the resist underlayer film.

* * * * *